(12) United States Patent
Nagai et al.

(10) Patent No.: US 8,367,541 B2
(45) Date of Patent: Feb. 5, 2013

(54) SEMICONDUCTOR DEVICE SUITABLE FOR A FERROELECTRIC MEMORY AND MANUFACTURING METHOD OF THE SAME

(75) Inventors: Kouichi Nagai, Kawasaki (JP); Hitoshi Saito, Kawasaki (JP); Kaoru Sugawara, Kawasaki (JP); Makoto Takahashi, Kawasaki (JP); Masahito Kudo, Kawasaki (JP); Kazuhiro Asai, Kawasaki (JP); Yukimasa Miyazaki, Kawasaki (JP); Katsuhiro Sato, Kawasaki (JP); Kaoru Saigoh, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 268 days.

(21) Appl. No.: 11/189,866

(22) Filed: Jul. 27, 2005

(65) Prior Publication Data

US 2006/0220081 A1 Oct. 5, 2006

(30) Foreign Application Priority Data

Mar. 30, 2005 (JP) ................................ 2005-099063

(51) Int. Cl.
*H01L 21/4763* (2006.01)
(52) U.S. Cl. . 438/627; 257/751; 257/295; 257/E21.664; 438/643; 438/653; 438/927
(58) Field of Classification Search .............. 257/295, 257/751, E21.664, E23.137; 438/627
See application file for complete search history.

(56) References Cited

U.S. PATENT DOCUMENTS

| | | | |
|---|---|---|---|
| 5,376,590 A | 12/1994 | Machida et al. | |
| 5,512,513 A | 4/1996 | Machida et al. | |
| 5,811,872 A | 9/1998 | Machida et al. | |
| 6,440,833 B1 | 8/2002 | Lee et al. | |
| 6,627,462 B1 | 9/2003 | Yang et al. | |
| 6,642,100 B2 * | 11/2003 | Yang et al. | 438/253 |
| 6,642,622 B2 | 11/2003 | Usui et al. | |
| 6,649,954 B2 * | 11/2003 | Cross | 257/295 |
| 6,995,082 B2 | 2/2006 | Lee | |
| 7,190,015 B2 * | 3/2007 | Natori et al. | 257/306 |
| 2001/0020708 A1 * | 9/2001 | Kasai | 257/295 |
| 2002/0011616 A1 * | 1/2002 | Inoue et al. | 257/295 |
| 2003/0006439 A1 * | 1/2003 | Bailey | 257/295 |
| 2003/0071293 A1 * | 4/2003 | Otani et al. | 257/295 |
| 2003/0160327 A1 | 8/2003 | Usui et al. | |
| 2006/0223334 A1 * | 10/2006 | Saki | 438/765 |

FOREIGN PATENT DOCUMENTS

| | | | |
|---|---|---|---|
| JP | 55-086122 A | 6/1980 | |
| JP | 59-211236 A | 11/1984 | |
| JP | 62-128128 A | 6/1987 | |
| JP | 62-242331 A | 10/1987 | |
| JP | 62-263642 A | 11/1987 | |

(Continued)

OTHER PUBLICATIONS

Patent Abstracts of Japan, Publication No. 62248239, dated Oct. 29, 1987.

(Continued)

*Primary Examiner* — Ajay K Arora
(74) *Attorney, Agent, or Firm* — Westerman, Hattori, Daniels & Adrian, LLP

(57) ABSTRACT

After a ferroelectric capacitor is formed, an Al wiring (conductive pad) connected to the ferroelectric capacitor is formed. Then, a silicon oxide film and a silicon nitride film are formed around the Al wiring. Thereafter, as a penetration inhibiting film which inhibits penetration of moisture into the silicon oxide film, an $Al_2O_3$ film is formed.

8 Claims, 36 Drawing Sheets

FOREIGN PATENT DOCUMENTS

| | | | |
|---|---|---|---|
| JP | 4-36230 | U | 3/1992 |
| JP | 4-251926 | A | 9/1992 |
| JP | 5-343534 | A | 12/1993 |
| JP | 7-37977 | A | 2/1995 |
| JP | 07-273102 | A | 10/1995 |
| JP | 10-163318 | A | 6/1998 |
| JP | 11-26583 | A | 1/1999 |
| JP | 2003-324103 | A | 11/2003 |
| KR | 2001-0004372 | | 1/2001 |
| KR | 2004-0054097 | | 6/2004 |

OTHER PUBLICATIONS

Patent Abstracts of Japan, Publication No. 04058531, dated Feb. 25, 1992.

Patent Abstracts of Japan, Publication No. 06069270, dated Mar. 11, 1994.

Patent Abstracts of Japan, Publication No. 10092817, dated Apr. 10, 1998.

Chinese Office Action dated Sep. 21, 2007 issued in corresponding Application No. 200510092678.8.

Japanese Office Action dated Feb. 16, 2010, issued in corresponding Japanese Patent Application No. 2005-099063.

Japanese Office Action dated May 11, 2010, issued in corresponding Japanese Patent Application No. 2005-099063 (w/ partial translation).

Japanese Office Action dated Nov. 15, 2011, issued in corresponding Japanese Patent Application No. 2005-099063 with a partial English translation, Only the provided partial English translation was considered.

Korean Office Action dated Oct. 27, 2006, Application No. 10-2005-0068781.

Japanese Office Action dated Jul. 17, 2012, issued in corresponding Japanese Patent Application No. 2005-099063, (21 pages). w/ Partial English Translation.

Semiconductor Terminological Dictionary Editorial Committee's Edition, Nikkan Kogyo Shimbun, Ltd , "Semiconductor Terminological Dictionary", First Version, dated Mar. 20, 1999, (3 pages). w/English Translation; cited in Japanese OA dated Jul. 17, 2012.

* cited by examiner

PAD OPENING PORTION

35

PAD OPENING PORTION

LOGIC CIRCUIT SECTION

TiN FILM

TiN FILM

LOGIC CIRCUIT SECTION

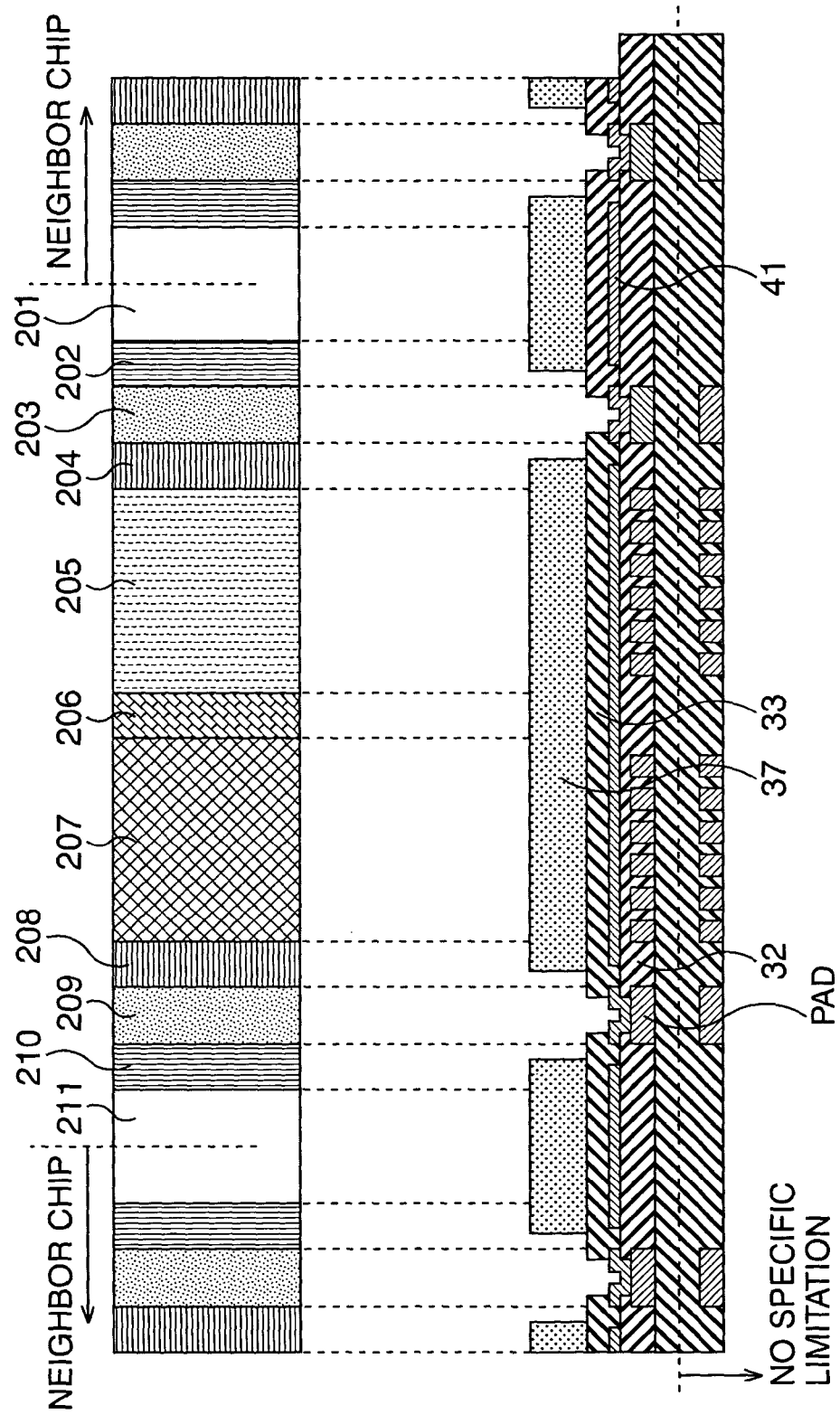

SEMICONDUCTOR DEVICE SUITABLE FOR A FERROELECTRIC MEMORY AND MANUFACTURING METHOD OF THE SAME

CROSS-REFERENCE TO RELATED APPLICATIONS

This application is based upon and claims the benefit of priority from the prior Japanese Patent Application No. 2005-099063, filed on Mar. 30, 2005, the entire contents of which are incorporated herein by reference.

BACKGROUND OF THE INVENTION

1. Field of the Invention

The present invention relates to a semiconductor device suitable for a ferroelectric memory and a manufacturing method of the same.

2. Description of the Related Art

In recent years, the development of a ferroelectric memory (FeRAM) which holds information in a ferroelectric capacitor using polarization inversion of a ferroelectric has been advanced. The ferroelectric memory is a nonvolatile memory in which held information is not erased even if the power is turned off, and attracts special attention because it can realize high-density integration, an increase in driving speed, an improvement in durability, and a reduction in power consumption.

As materials for a ferroelectric film composing the ferroelectric capacitor, ferroelectric oxides having a perovskite crystal structure such as $PZT(Pb(Zr, Ti)O_3))$, SBT $(SrBi_2Ta_2O_9)$, and the like are mainly used. These materials can obtain a remanent polarization amount as large as approximately 10 $\mu C/cm^2$ to 30 $\mu C/cm^2$. However, regarding such a ferroelectric film, it is known that ferroelectric characteristics deteriorate due to moisture which has penetrated from the outside through an interlayer insulating film such as a silicon oxide film having a high affinity to moisture. The moisture which has penetrated into the ferroelectric memory (semiconductor device) from the outside is decomposed into hydrogen and oxygen during a high-temperature process when the interlayer insulating film and a metal wiring are formed. Then, the hydrogen which has reached the ferroelectric film reacts with oxygen in the ferroelectric film to cause oxygen deficiency to the ferroelectric film, which results in a reduction in crystallinity.

Moreover, if a ferroelectric memory is used over a long period of time after being manufactured, in some cases, the remanent polarization amount and dielectric constant of the ferroelectric film reduce accompanying the penetration of hydrogen, and thereby the performance of the ferroelectric capacitor deteriorates. Such a deterioration in performance occurs not only in the ferroelectric capacitor but also in other semiconductor elements such as a transistor.

FIG. 19 shows a general view of a semiconductor circuit on which general logic circuits or ferroelectric capacitors are mounted. It shows a multi-tip structure, in which plural chips are formed in one shot. FIG. 20 shows an enlarged view of one chip. As shown in FIG. 20, one chip is partitioned into a PAD section located at an outer periphery of the chip and a circuit section located inside the PAD section. In the case of a product in which both the logic circuit and the ferroelectric capacitor are mounted, the circuit section is further partitioned into a FeRAM section and a logic section. FIG. 21 shows a layout of a section taken along the line X-Y in FIG. 20. From the X side, this chip is partitioned into a scribe section 501, a scribe section-PAD section boundary section 502, a PAD section 503, a PAD section-circuit section boundary section 504, a FeRAM section (cell section) 505, a circuit-circuit boundary section 506, a logic section 507, a PAD section-circuit section boundary section 508, a PAD section 509, a scribe section-PAD section boundary section 510, and a scribe section 511. Outside the scribe sections 501 and 511 are regions for other chips.

FIG. 22 is a sectional view showing the structure of the PAD section (a sectional view taken along the line A-B) of the semiconductor circuit on which the general logic circuit or the ferroelectric capacitor is mounted. As shown in FIG. 22, a silicon oxide film 522 and a silicon nitride film 523 are formed as a passivation film on a PAD wiring portion (wiring portion 526), and a polyimide layer (PI layer) 524 is formed thereon. The PAD wiring portion 526 is formed on a wiring portion 521 with wiring contact portions 525 therebetween. A silicon oxide film 527 is formed between the wiring portion 521 and the PAD wiring portion 526. Such a structure is a general PAD structure, but this PAD structure has the following problems.

First, the silicon oxide film 522 does not have a moisture and hydrogen barrier function, and if anything, it has hygroscopicity. Accordingly, when the silicon oxide film 522 is exposed to the surface, it allows moisture and hydrogen to permeate therethrough.

Secondly, the silicon nitride film 523 has a moisture barrier function to some extent, but allows hydrogen to permeate therethrough. If the silicon nitride film 523 is thickened simply in order to prevent moisture, a moisture barrier property is correspondingly improved. However, gas (for example, ammonia) containing a hydrogen group is used in the process of forming the silicon nitride film 523, whereby the ferroelectric capacitor deteriorates due to the influence thereof. Therefore, the silicon nitride film cannot be thickened excessively.

Thirdly, similarly to the silicon oxide film 522, the polyimide layer 524 has no moisture and hydrogen barrier property.

Hence, the following events occur in conventional PAD section structure and circuit section structure.

(A) Moisture and hydrogen penetrate into the PAD section.

(B) Hydrogen and a little moisture penetrate into the circuit section.

Namely, in the conventional PAD section structure, the penetration of moisture and hydrogen cannot be fully prevented. Moreover, as shown in FIG. 23, the silicon nitride film 523 may crack.

To improve these problems, a technique for preventing the penetration of moisture and hydrogen by using a metal film is disclosed in Patent Documents 1 and 4. A principal structure thereof is shown in FIG. 24. A metal wiring 532, an insulating film 533, a passivation film 534, and a bonding pad 535 are formed on an interlayer insulating film 531. This structure is characterized in that a metal PAD section is further formed on the PAD section to prevent the silicon oxide film above the PAD section from being exposed. However, even in this structure, the following events occur.

(A) No moisture penetrates into the PAD section. The hydrogen barrier property is high because of a metal film. However, in actuality, a sidewall of the metal PAD section on the PAD section easily cracks. Moreover, when the structure of such a publicly known example is adopted, it is necessary that after the metal PAD section is formed thick, it is subjected to CMP processing to be planarized or subjected to plating. But, this is not described in Patent Documents 1 and 4. Accordingly, the structure formed by the method described in Patent Documents 1 and 4 is as shown in FIG. 25. Further, a structure shown in FIG. 26 is disclosed as the structure obtained after the CMP processing, but in the case of this structure, micro-scratches are generated in the passivation film (silicon nitride film) 534 at the time of the CMP processing of the PAD section.

(B) A little moisture and hydrogen as it is penetrate into the circuit section.

(C) Since the passivation film is used as an etching stopper when the second metal film is formed, irregularities occur on the surface, and hydrogen easily penetrates from its microscopic irregular portions.

A technique for preventing the penetration of moisture and hydrogen is disclosed also in Patent Document 2. A principal structure thereof is shown in FIG. 27A and FIG. 27B. An aluminum film 542, an interlayer film 543, an aluminum film 544, and a cover film 545 are formed on a semiconductor substrate 541, and a bonding wire 546 is connected to the aluminum film 544. In this structure, the PAD section is entirely coated with the metal film (aluminum film 544), but the following events occur.

(A) No moisture penetrates into the PAD section. A method of forming the aluminum film 544 is not described, but by adopting such a structure, only in the PAD section, the penetration of moisture is eliminated and the penetration of hydrogen is reduced.

(B) There is no description of the circuit section, but considering a technical level of those days, it is thought that the circuit section has a structure such as shown in FIG. 28. In this structure, moisture and hydrogen penetrate from above.

A technique for preventing the penetration of moisture and hydrogen is disclosed also in Patent Document 3. A principal structure thereof is shown in FIG. 29. An interlayer insulating film 552, a pad metal film 553, a PSG film 554, a silicon nitride film 555, and a metal film 556 are formed on a semiconductor substrate 551. In this structure, the PAD section is entirely coated with the metal film 556, but the following events occur.

(A) Since the PAD section is coated with the metal film 556, no moisture penetrates thereinto. However, when the metal film 556 is an aluminum film, its hydrogen barrier property is not so high, whereby a little hydrogen penetrates. Further, since the metal film 556 on a sidewall of the PAD section cannot be formed thick by a sputtering method, there is a possibility that a crack opens later.

(B) There is no description of the circuit section, but considering a technical level of those days, it is thought that the circuit section has a structure such as shown in FIG. 30. In this structure, moisture and hydrogen penetrate from above.

As just described, even if these conventional techniques are adopted, it is extremely difficult to fully inhibit deterioration of the ferroelectric capacitor or the like accompanying the penetration of moisture.

The related arts are disclosed in Patent Document 1 (Japanese Patent Application Laid-open No. Hei 10-92817), Patent Document 2 (Japanese Patent Application Laid-open No. Hei 6-69270), Patent Document 3 (Japanese Patent Application Laid-open No. Hei 4-58531), and Patent Document 4 (Japanese Patent No. 3305211).

SUMMARY OF THE INVENTION

An object of the present invention is to provide a semiconductor device capable of inhibiting deterioration accompanying the penetration of moisture and hydrogen and a manufacturing method of the same.

As a result of assiduous study to solve the aforementioned problems, the present inventors have arrived at aspects of the present invention shown below.

In a semiconductor device according to the present invention, an element, a conductive pad connected to the element, and a silicon oxide film formed around the conductive pad are provided. Further provided is a penetration inhibiting film inhibiting penetration of hydrogen and moisture into the silicon oxide film.

In a manufacturing method of a semiconductor device according to the present invention, after an element is formed, a conductive pad connected to the element is formed. Then, a silicon oxide film is formed around the conductive pad. Thereafter, a penetration inhibiting film which inhibits penetration of hydrogen and moisture into the silicon oxide film is formed. It is desirable to form the penetration inhibiting film not only on a PAD section but also extensively on a circuit and on a scribe.

BRIEF DESCRIPTION OF THE DRAWINGS

FIG. 16 is a diagram showing the TiN film 41;

DETAILED DESCRIPTION OF THE PREFERRED EMBODIMENTS

Figure 1:
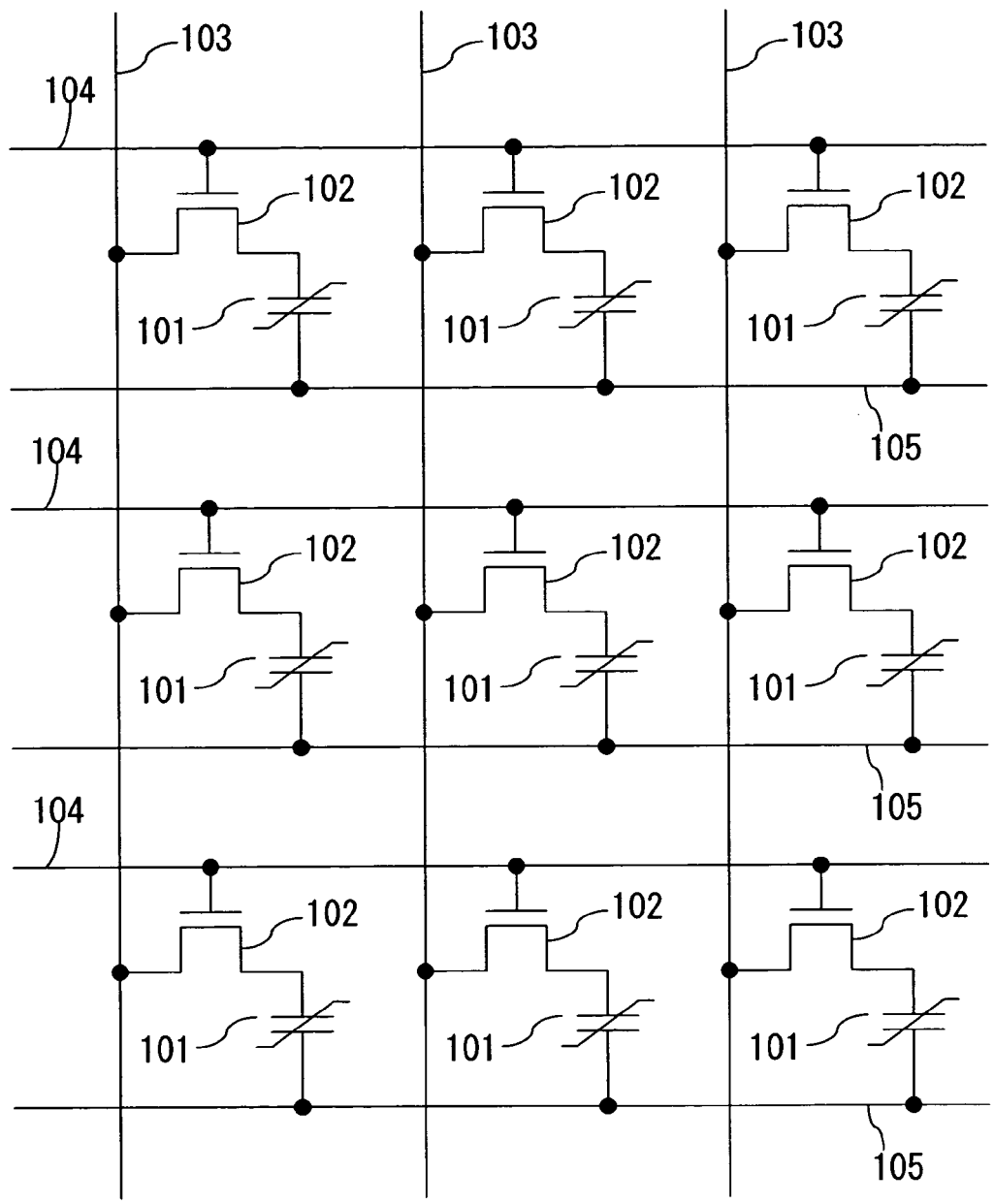
FIG. 1 is a circuit diagram showing a configuration of a memory cell array of a ferroelectric memory manufactured by methods according to embodiments of the present invention.

Embodiments of the present invention will be specifically described below with reference to the attached drawings. FIG. 1 is a circuit diagram showing the configuration of a memory cell array of a ferroelectric memory (semiconductor device) manufactured by methods according to embodiments of the present invention.

In this memory cell array, plural bit lines 103 which extend in one direction and plural word lines 104 and plate lines 105 which extend in a direction perpendicular to the direction in which the bit lines 103 extend are provided. Additionally, plural memory cells of a ferroelectric memory are arranged in an array form in such a manner as to match a grid composed of these bid lines 103, word lines 104, and plate lines 105. In each memory cell, a ferroelectric capacitor (storage part) 101 and a MOS transistor (switching part) 102 are provided.

A gate of the MOS transistor 102 is connected to the word line 104. One source/drain of the MOS transistor 102 is connected to the bit line 103 and the other source/drain thereof is connected to one electrode of the ferroelectric capacitor 101. The other electrode of the ferroelectric capacitor 101 is connected to the plate line 105. Incidentally, each of the word lines 104 and the plate lines 105 is shared by plural MOS transistors 102 arranged in the same direction as the direction in which this line extends. Similarly, each of the bit lines 103 is shared by plural MOS transistors 102 arranged in the same direction as the direction in which this line extends. The direction in which the word lines 104 and the plate lines 105 extend and the direction in which the bit lines 103 extend are sometimes called a row direction and a column direction, respectively. It is noted that the arrangement of the bit lines 103, the word lines 104, and the plate lines 105 is not limited to the arrangement described above.

In the memory cell array of the ferroelectric memory thus configured, data is stored according to the polarization state of a ferroelectric film provided in the ferroelectric capacitor 101.

First Embodiment

Next, the first embodiment of the present invention will be described. Note that here, for convenience, a cross-sectional structure of a semiconductor device will be described with a manufacturing method thereof. FIG. 2A to FIG. 2H are sectional views showing a manufacturing method of a ferroelectric memory (semiconductor device) according to the first embodiment of the present invention step by step.

Figure 10:
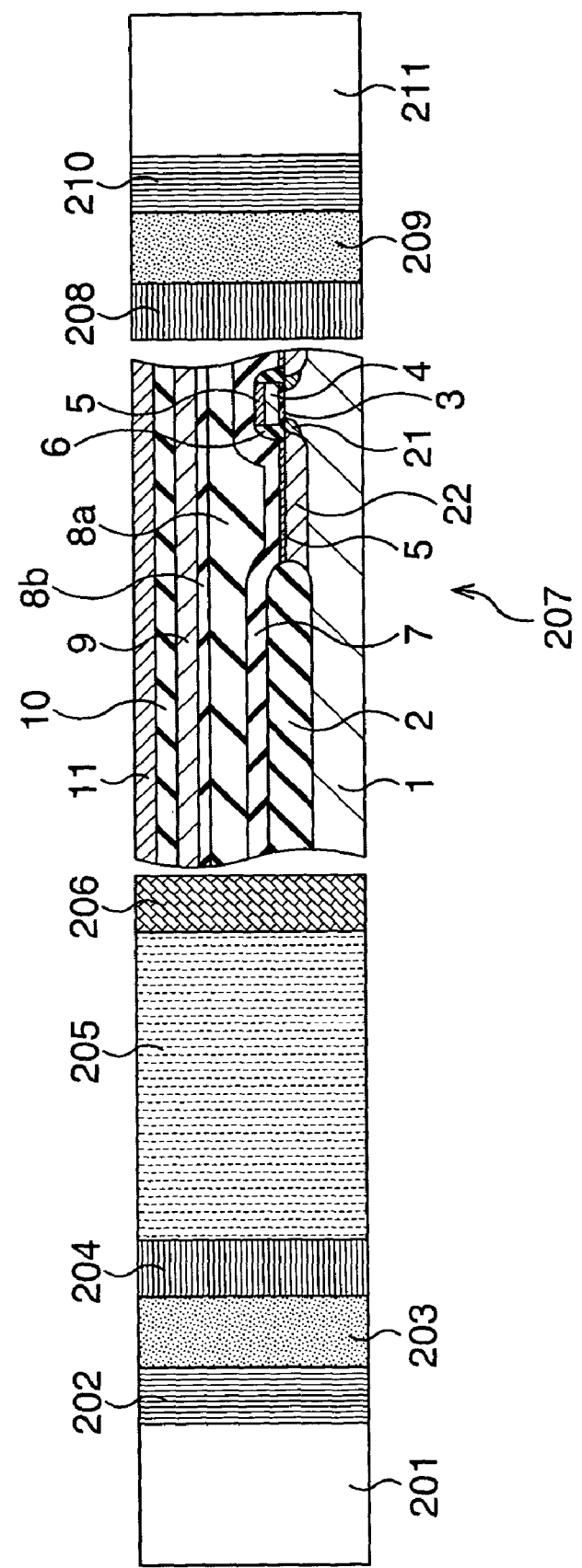
FIG. 10 is a diagram showing a layout of a section of a semiconductor device according to the embodiments of the present invention.

Manufactured as the semiconductor device according to the embodiment is a semiconductor device which, as shown in FIG. 10, includes, from the left, a scribe section 201, a scribe section-PAD section boundary section 202, a PAD section 203, a PAD section-circuit section boundary section 204, a logic section 205, a circuit-circuit boundary section 206, a FeRAM section (ferroelectric capacitor section) 207, a PAD section-circuit section boundary section 208, a PAD section 209, a scribe section-PAD section boundary section 210, and a scribe section 211.

In the following description, methods of forming regions other than the FeRAM section 207 are represented by a method of forming the FeRAM section 207, and hence the explanation thereof is omitted.

Figure 11:
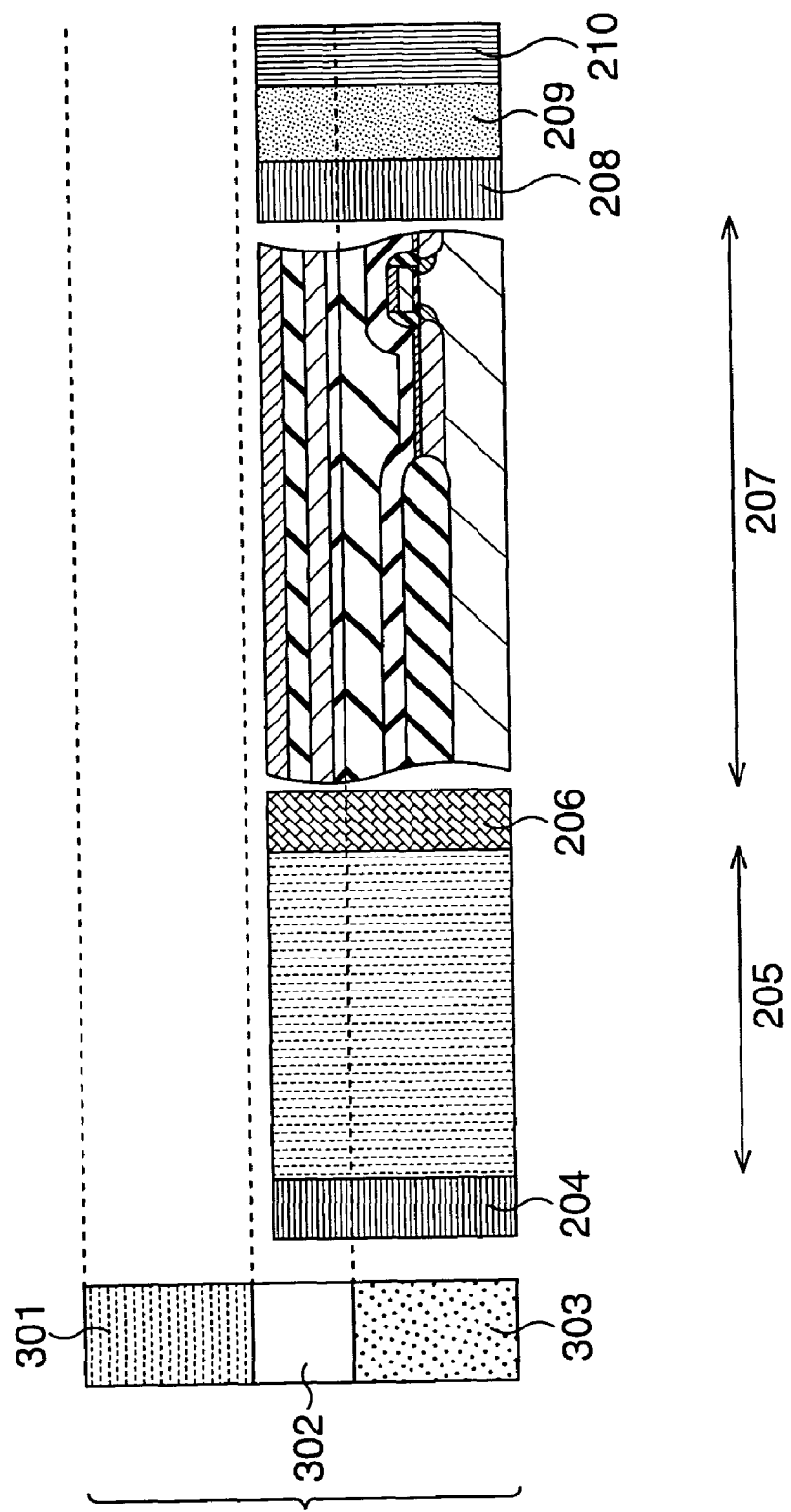
FIG. 11 is a sectional view showing a vertical structure of a semiconductor device according to the embodiments of the present invention.

Incidentally, as shown in FIG. 11, if the vertical structure of the semiconductor device is partitioned, it is also said that the semiconductor device is composed of a wiring layer 301, a ferroelectric layer 302, and a transistor layer 303. The transistor layer 303 contains a transistor (not shown) used in a FeRAM memory and a transistor (not shown) used in the logic section 205. In the FeRAM 207, the transistor is located near or under a FeRAM capacitor, and in the logic section 205, the transistor is located near or under a logic circuit. Incidentally, to simplify the figure, the transistor in the logic section 205 is omitted from the figure.

Figure 2A:
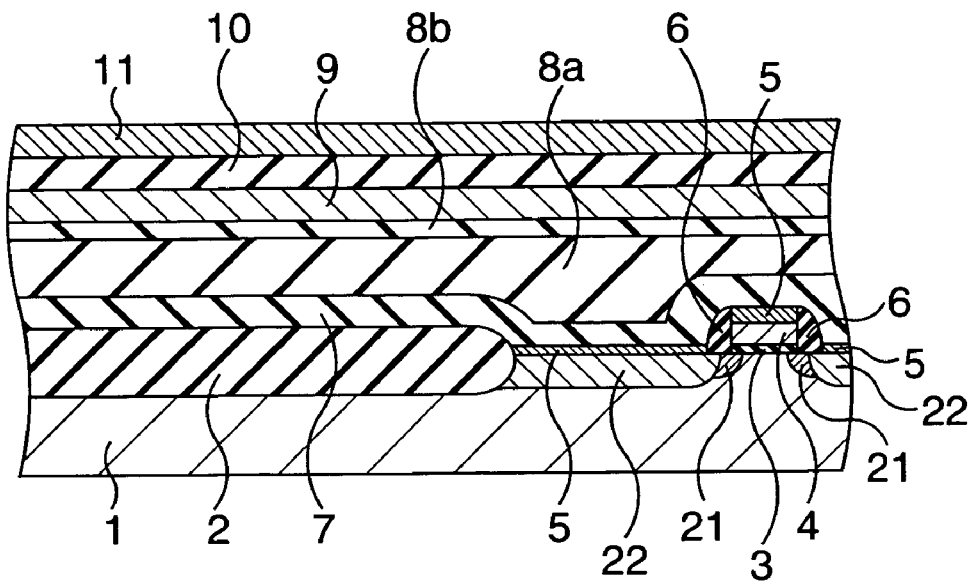
FIG. 2A to FIG. 2H are sectional views showing a manufacturing method of a ferroelectric memory according to a first embodiment of the present invention step by step.

In this embodiment, first, as shown in FIG. 2A and FIG. 10, an element isolation insulating film 2 which demarcates an element active region is formed on the surface of a semiconductor substrate 1 such as a Si substrate, for example, by a LOCOS (Local Oxidation of Silicon) method. Then, a transistor (MOSFET) which includes a gate insulating film 3, a gate electrode 4, a silicide layer 5, a sidewall 6, and a source/drain diffusion layer composed of a low-concentration diffusion layer 21 and a high-concentration diffusion layer 22 is formed in the element active region demarcated by the element isolation insulating film 2. This transistor corresponds to the MOS transistor 102 in FIG. 1. As the gate insulating film 3, a $SiO_2$ film having a thickness of approximately 100 nm is formed, for example, by thermal oxidation. Subsequently, a silicon oxynitride film 7 is formed over the entire surface so as to cover the MOSFET, and a silicon oxide film 8a is further formed over the entire surface. The silicon oxynitride film 7 is formed to prevent hydrogen deterioration of the gate insulating film 3 and so on when the silicon oxide film 8a is formed. The silicon oxide film 8a is formed by a CVD method, for example, with using TEOS (tetraethylorthosilicate) as material, and a thickness thereof is approximately 700 nm, for example.

Thereafter, the silicon oxide film 8a is degassed by annealing at 650° C. for 30 minutes in an $N_2$ atmosphere. Then, as a bottom electrode adhesive layer, an $Al_2O_3$ film 8b with a thickness of approximately 20 nm is formed on the silicon oxide film 8a, for example, by a sputtering method. A bottom electrode film 9 is formed on the $Al_2O_3$ film 8b. As the bottom electrode film 9, a Pt film with a thickness of approximately 150 nm is formed, for example, by a sputtering method.

Then, similarly as shown in FIG. 2A, a ferroelectric film 10 is formed in an amorphous state on the bottom electrode film 9. As the ferroelectric film 10, a PLZT film with a thickness approximately between 100 nm and 200 nm is formed, for example, using a PLZT((Pb, La)(Zr, Ti)$O_3$) target by a RF sputtering method. Subsequently, RTA (Rapid Thermal Annealing) at 650° C. or lower in an atmosphere containing Ar and $O_2$ is performed, and further RTA at 750° C. in an oxygen atmosphere is performed. As a result, the ferroelectric film 10 is completely crystallized, and the Pt film, which composes the bottom electrode film 9, is densified, which inhibits mutual diffusion between Pt and O in the vicinity of an interface between the bottom electrode film 9 and the ferroelectric film 10.

Thereafter, similarly as shown in FIG. 2A, a top electrode film 11 is formed on the ferroelectric film 10. In the formation of the top electrode film 11, an iridium oxide film with a thickness approximately between 200 nm and 300 nm is formed, for example, by a sputtering method.

Figure 2B:
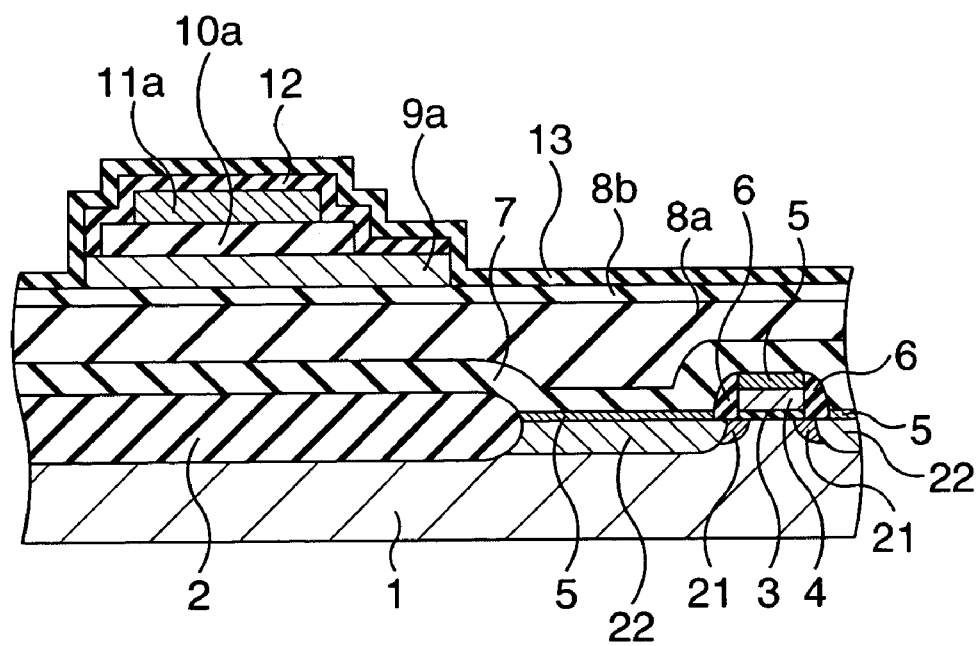

Then, by patterning the top electrode film 11, as shown in FIG. 2B, a top electrode 11a is formed. Subsequently, heat treatment in an atmosphere containing oxygen to recover damage and the like caused by patterning is performed. Thereafter, by patterning the ferroelectric film 10, similarly as shown in FIG. 2B, a capacitor insulating film 10a is formed. Then, oxygen annealing for preventing an $Al_2O_3$ film to be formed later from peeling off is performed. Subsequently, similarly as shown in FIG. 2B, as a protective film, an $Al_2O_3$ film 12 is formed over the entire surface by a sputtering method. Thereafter, to mitigate damage caused by sputtering, oxygen annealing is performed. Penetration of hydrogen into the ferroelectric capacitor from the outside is prevented by the protective film ($Al_2O_3$ 12).

Then, similarly as shown in FIG. 2B, by patterning the $Al_2O_3$ film 12 and the bottom electrode film 9, a bottom electrode 9a is formed. Subsequently, oxygen annealing for preventing an $Al_2O_3$ film to be formed later from peeling off is performed. The ferroelectric capacitor including the bottom electrode 9a, the capacity insulating film 11a, and the top electrode 11a corresponds to the ferroelectric capacitor 101 in FIG. 1. Thereafter, similarly as shown in FIG. 2B, as a protective film, an $Al_2O_3$ film 13 is formed over the entire surface by a sputtering method. Then, oxygen annealing is performed in order to reduce capacitor leakage.

Figure 2C:
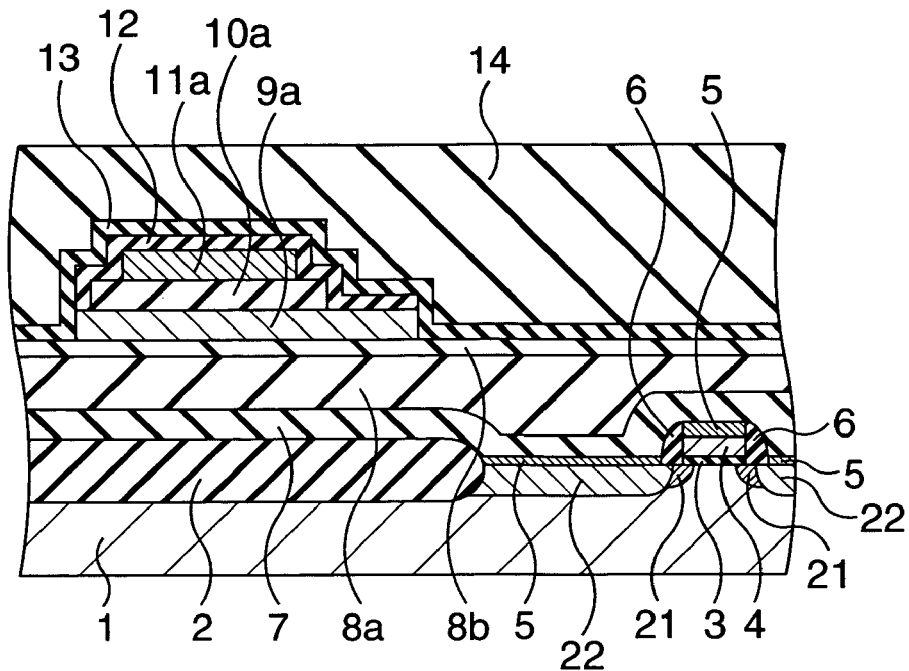

Subsequently, as shown in FIG. 2C, an interlayer insulating film 14 is formed over the entire surface by a high density plasma method. The thickness of the interlayer insulating film 14 is, for example, approximately 1.5 µm. Thereafter, the interlayer insulating film 14 is planarized by a CMP (chemical mechanical polishing) method. Then, plasma processing using an $N_2O$ gas is performed. As a result, a surface layer portion of the interlayer insulating film 14 is slightly nitrided and thereby it becomes difficult for moisture to penetrate thereinto. Incidentally, this plasma processing is effective if gas containing at least one of N and O is used.

Figure 2D:
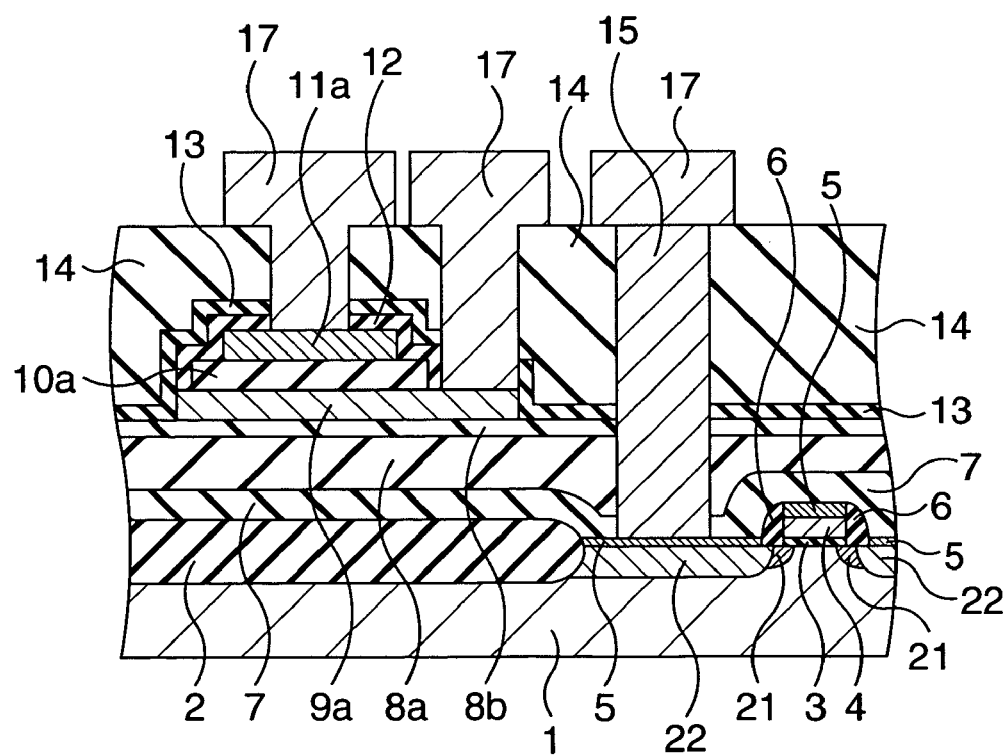

Subsequently, as shown in FIG. 2D, a hole which reaches the silicide layer 5 on the high-concentration diffusion layer 22 of the transistor is formed in the interlayer insulating film 14, the $Al_2O_3$ film 8b, the silicon oxide film 8a, and the silicon oxynitride film 7. Thereafter, by forming a Ti film and a TiN film continuously in the hole by a sputtering method, a barrier metal film (not shown) is formed. Subsequently, a W film is embedded in the hole by a CVD (chemical vapor deposition) method, and by planarizing the W film by a CMP method, a W plug 15 is formed.

Then, as an oxidation preventing film of the W plug 15, a SiON film (not shown) is formed, for example, by a plasma enhanced CVD method. Subsequently, a contact hole which reaches the top electrode 11a and a contact hole which reaches the bottom electrode 9a are formed in the SiON film, the interlayer insulating film 14, the $Al_2O_3$ film 13, and the $Al_2O_3$ film 12. Thereafter, to recover damage, oxygen annealing is performed. Then, by removing all the SiON film by etch-back, the surface of the W plug 15 is exposed. Then, similarly as shown in FIG. 2D, by forming a barrier metal film, an Al film, and a barrier metal film in a state where a portion of the surface of the top electrode 11a, a portion of the surface of the bottom electrode 9a, and the surface of the W plug 15 are exposed and patterning these films, a wiring 17 is formed. At this time, the W plug 15 and the top electrode 11a are connected to each other by a portion of the wiring 17, for example.

Figure 2E:
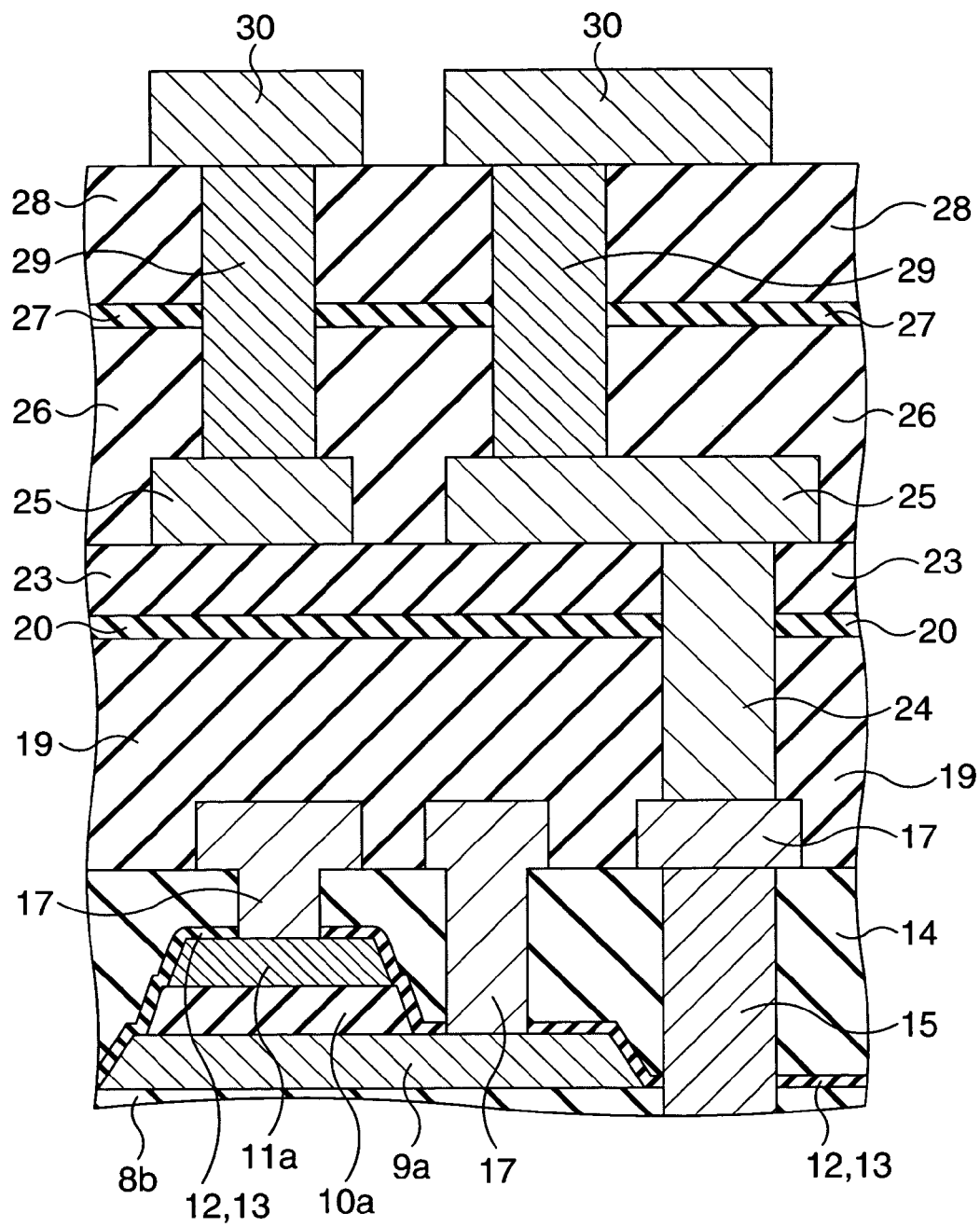

Subsequently, as shown in FIG. 2E, a silicon oxide film 19 is formed over the entire surface, for example, by a high density plasma method, and the surface thereof is planarized. Thereafter, on the silicon oxide film 19, an $Al_2O_3$ film 20 is formed as a protective film to prevent penetration of hydrogen and moisture over the entire surface of a chip. Further, a silicon oxide film 23 is formed on the $Al_2O_3$ film 20, for example, by a high density plasma method.

Then, similarly as shown in FIG. 2E, a via hole which reaches the wiring 17 is formed in the silicon oxide film 23, the $Al_2O_3$ film 20, and the silicon oxide film 19 and a W plug 24 is embedded therein.

Subsequently, similarly as shown in FIG. 2E, a wiring 25, a silicon oxide film 26, an $Al_2O_3$ film 27 over the entire surface of the chip, a silicon oxide film 28, W plugs 29, and an Al wiring 30 are formed.

Figure 2F:
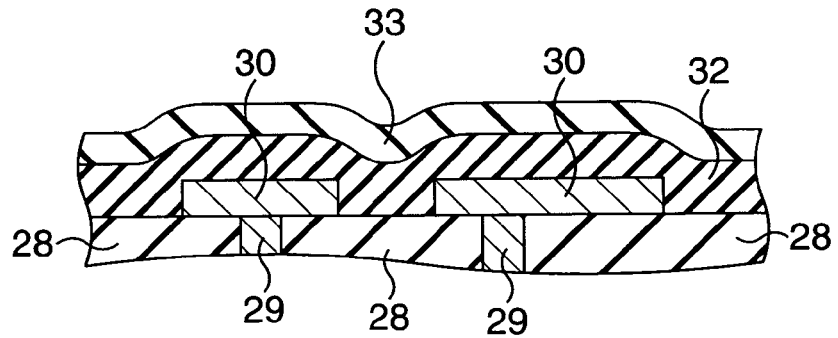

Thereafter, as shown in FIG. 2F, a silicon oxide film 32 and a silicon nitride film 33 are formed. In the formation of the silicon oxide film 32, for example, TEOS (tetraethylorthosilicate) is used as a material therefor. The thickness of the silicon oxide film 32 is approximately between 100 nm and 1500 nm. When CMP is performed after the silicon oxide film 32 is formed, approximately 1200 nm or more is preferable, but unless CMP is performed, approximately 100 nm is sufficient. The thickness of the silicon nitride film 33 is approximately between 100 nm and 1000 nm.

Figure 2G:
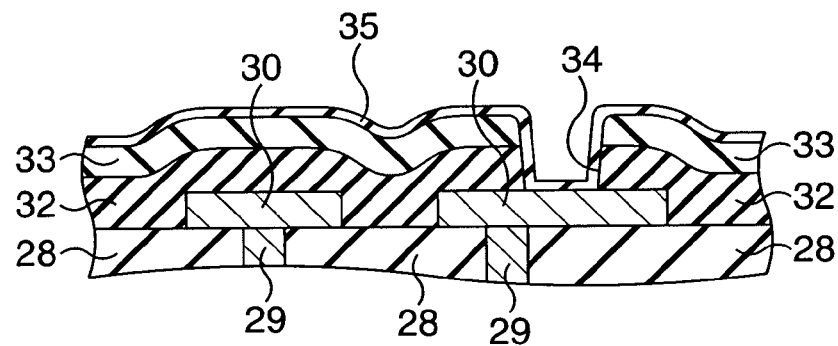

Then, as shown in FIG. 2G, an opening 34 to expose a portion of the Al wiring 30 is formed in the silicon oxide film 32 and the silicon nitride film 33. In the formation of the opening 34, for example, anisotropic etching using a resist pattern is performed. Subsequently, as a penetration inhibiting film which blocks the penetration of hydrogen and moisture into the silicon oxide film 32, an $Al_2O_3$ film 35 is formed over the entire surface. The thickness of the $Al_2O_3$ film 35 is preferably, for example, approximately between 30 nm and 100 nm when the $Al_2O_3$ film 35 is formed by a sputtering method, and sufficient to be 10 nm or more when it is formed by an MO-CVD method.

Figure 2H:
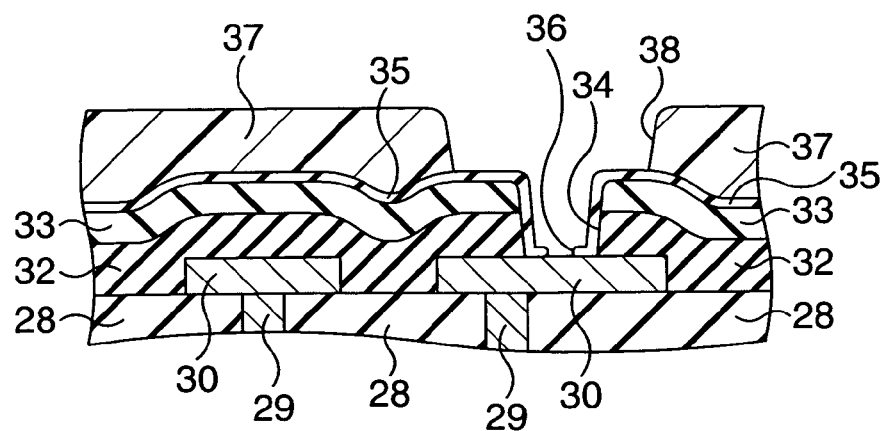
Figure 12:
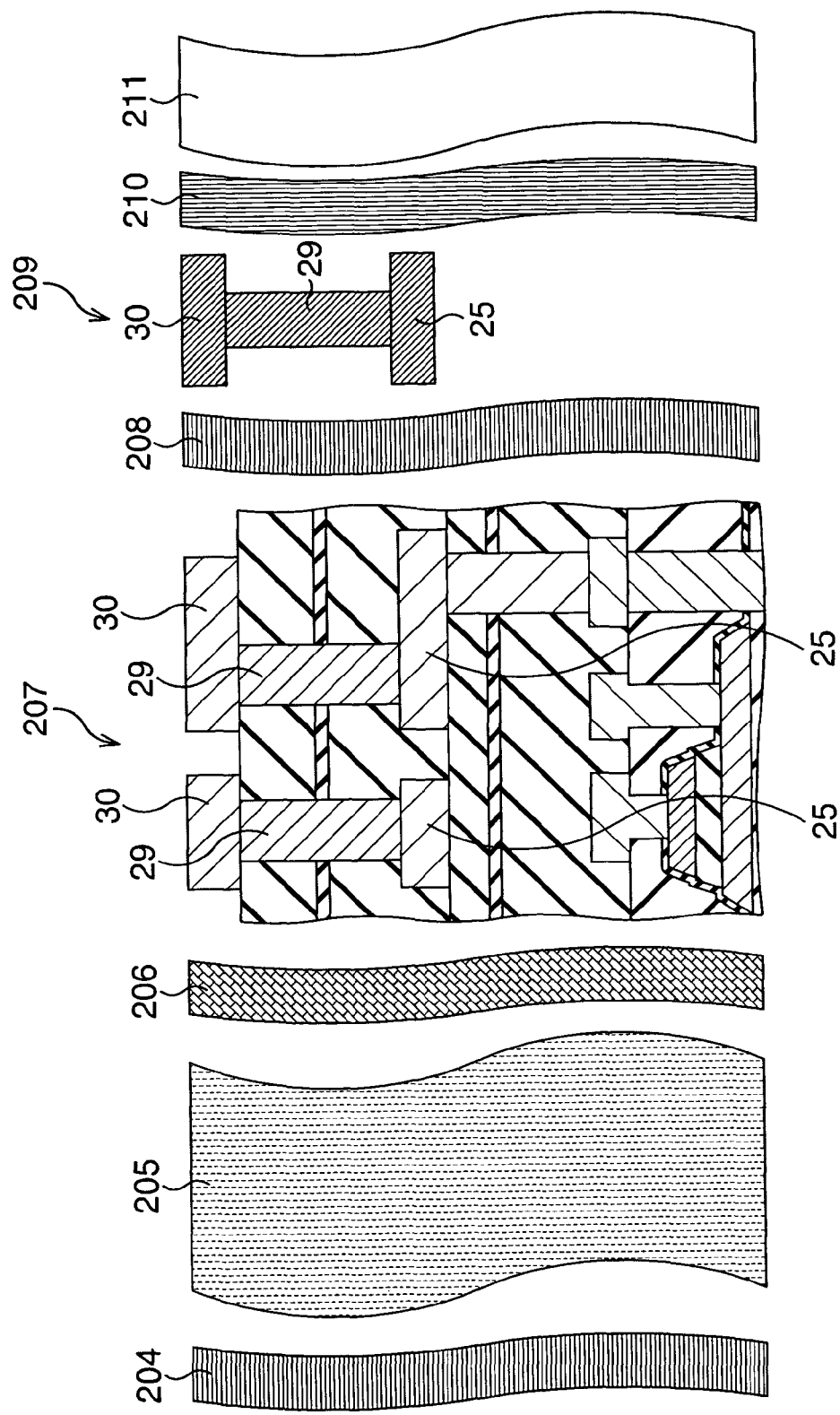
FIG. 12 is a sectional view showing a structure in which a portion of an Al wiring 30 is used as a pad.

Thereafter, as shown in FIG. 2H, an opening 36 to expose a portion of the Al wiring 30 is formed in the $Al_2O_3$ film 35. Then, a polyimide layer 37 is formed, and an opening 38 to expose the opening 36 is formed in the polyimide layer 37. The portion of the Al wiring 30 exposed from the openings 38 and 36 is used as a pad. FIG. 12 is a sectional view showing a structure in which a portion of the Al wiring 30 is used as a pad. Wiring to the pad may be formed in a layer of the Al wiring 30 or may be formed in a lower wiring layer.

Figure 13:
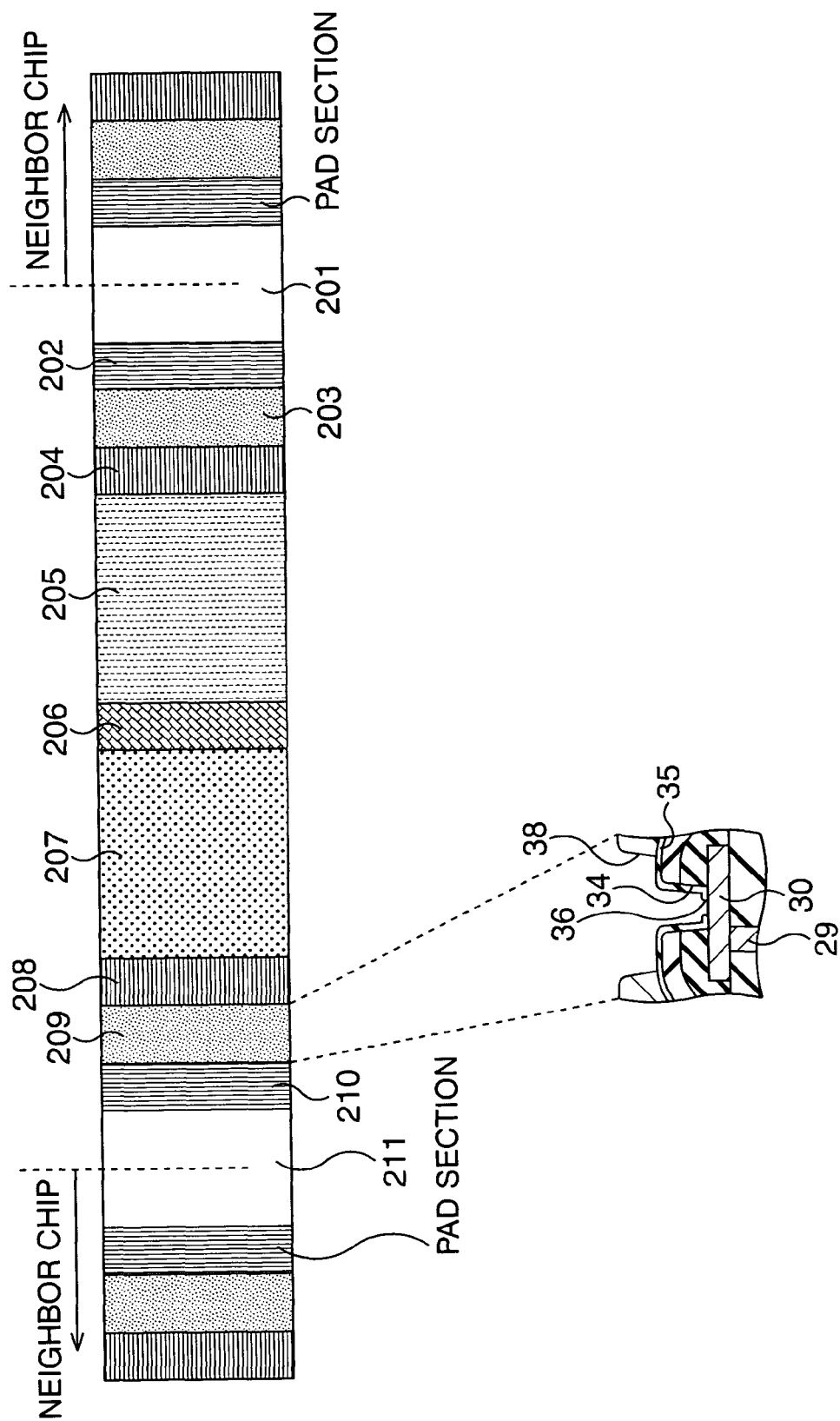
FIG. 13 is a diagram showing an $Al_2O_3$ film 35.
Figure 14A:
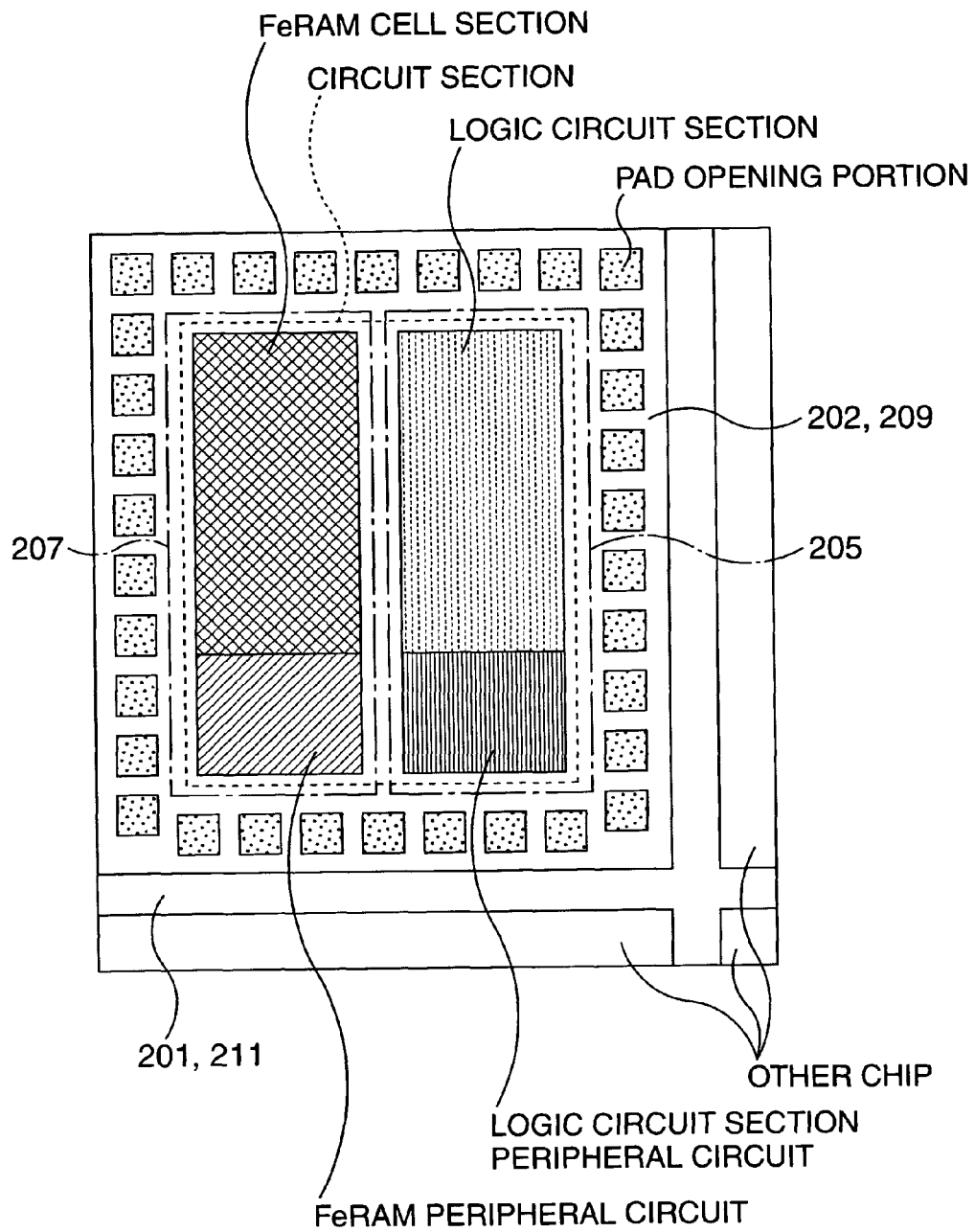
FIG. 14A is a diagram showing a layout (including other chips) of a semiconductor device according to the embodiments of the present invention.
Figure 14B:
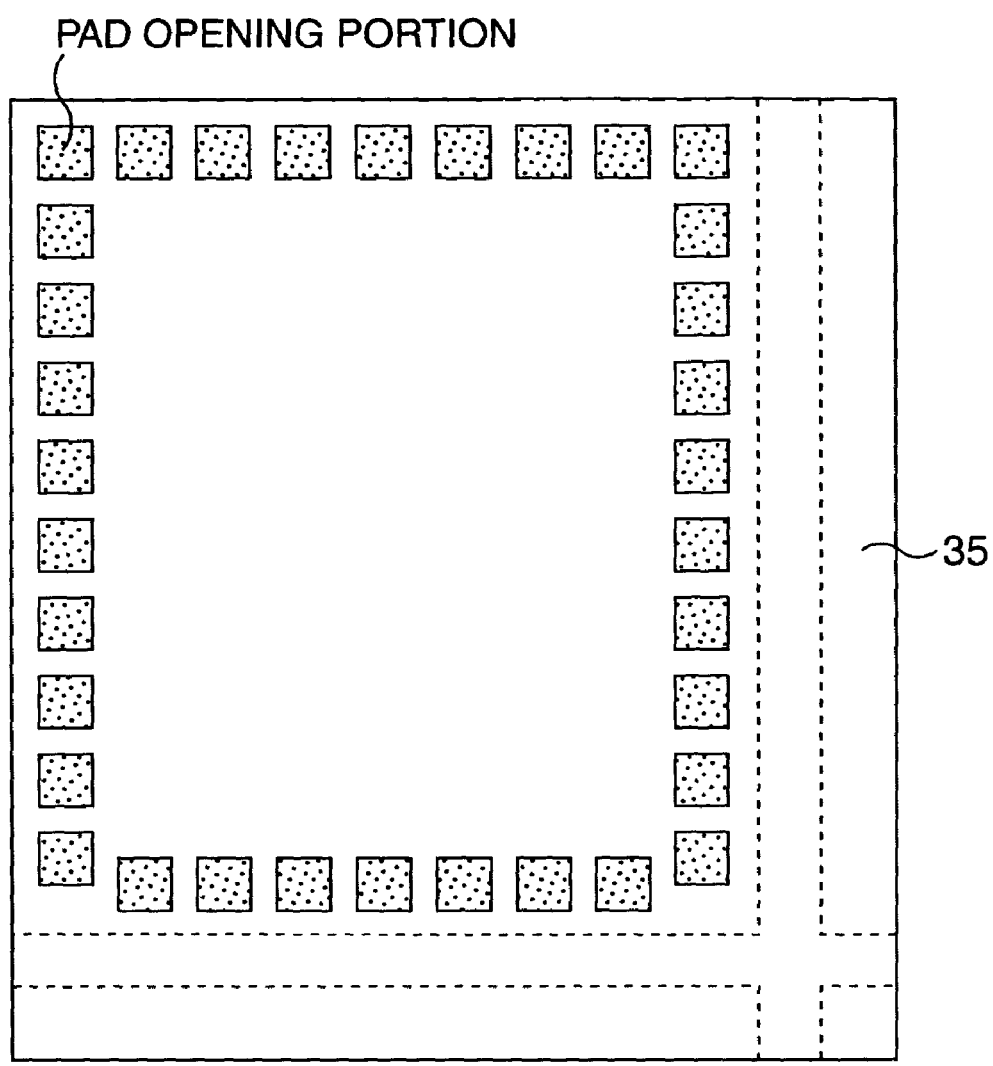
FIG. 14B is a diagram showing a layout of the $Al_2O_3$ film 35.

Incidentally, the $Al_2O_3$ film 35 as the penetration inhibiting film is placed in a region other than a PAD opening portions as shown in FIG. 13 and FIG. 14B. As described above, the semiconductor device can be partitioned into the scribe section 211, the scribe section-PAD section boundary section 210, the PAD section 209, the PAD section-circuit section boundary section 208, the FeRAM section (cell section) 207, the circuit-circuit boundary section 206, the logic section 205, and the PAD section-circuit section boundary section 204, and so on. The layout thereof is as shown in FIG. 14A. Note that the $Al_2O_3$ film 35 does not exist on the openings of the PAD section. Incidentally, a wiring under the PAD may be a Al—Cu wiring or an embedded Cu wiring.

Thus, the ferroelectric memory including the ferroelectric capacitor is completed.

As described above, according to this embodiment, the silicon oxide film 32 and the silicon nitride film 33 are covered with the $Al_2O_3$ film 35. Namely, the $Al_2O_3$ film 35 is formed on the silicon nitride film 33 not only on a side surface of the opening for the pad but also over the entire ferroelectric memory. Therefore, the diffusion of not only hydrogen and moisture penetrating from the opening for the pad but also hydrogen and moisture penetrating from the surface of the ferroelectric memory into the inside can be inhibited. This makes it possible to inhibit deterioration in the characteristics of the ferroelectric capacitor accompanying oxygen deficiency and the like. Incidentally, in structures described in conventional Patent Documents 1 to 3, it is difficult to block hydrogen and moisture penetrating from the surface of the semiconductor chip.

Second Embodiment

Figure 3A:
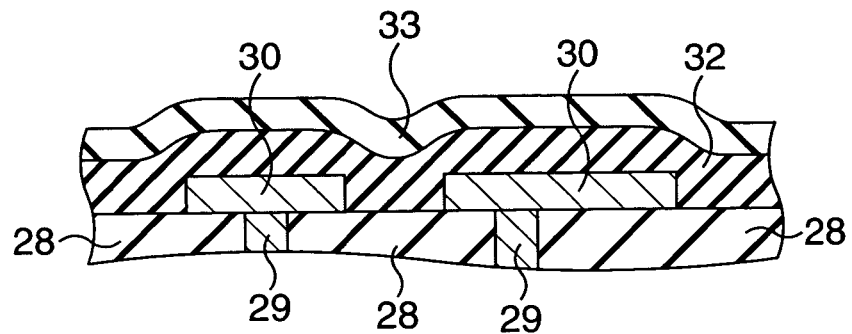
FIG. 3A to FIG. 3C are sectional views showing a manufacturing method of a ferroelectric memory according to a second embodiment of the present invention step by step.
Figure 3B:
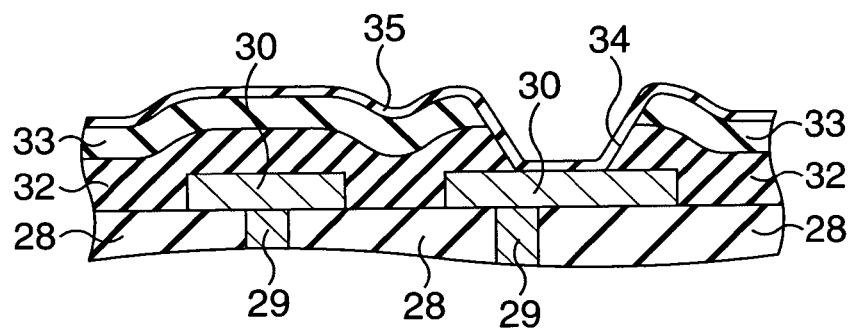
Figure 3C:
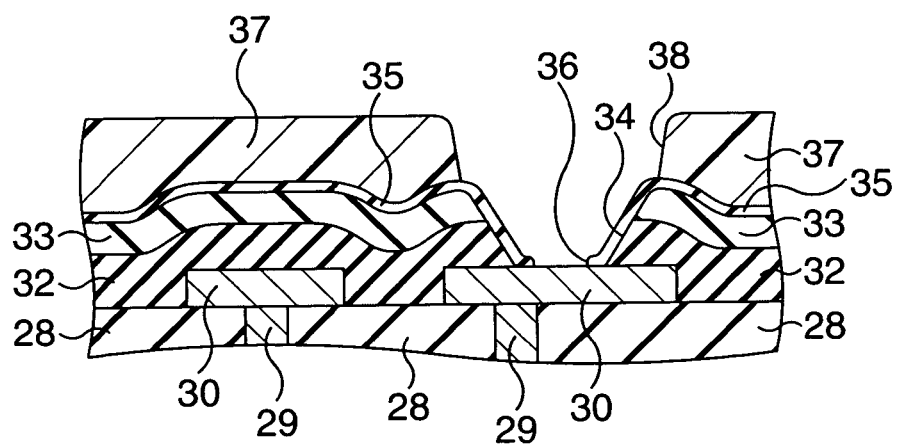

Next, the second embodiment of the present invention will be described. Note that here, for convenience, a cross-sectional structure of a semiconductor device will be described with a manufacturing method thereof. FIG. 3A to FIG. 3C are sectional views showing a manufacturing method of a ferroelectric memory (semiconductor device) according to the second embodiment of the present invention step by step.

In the second embodiment, first, as shown in FIG. 3A, a series of processing steps until the formation of the silicon oxide film 32 and the silicon nitride film 33 is performed in the same manner as in the first embodiment.

Then, as shown in FIG. 3B, the opening 34 to expose a portion of the Al wiring 30 is formed in the silicon oxide film 32 and the silicon nitride film 33 by isotropic etching. Subsequently, by performing sputtering etching in an Ar atmosphere, an upper end portion of the opening 34 is rounded off. Thereafter, in the same manner as in the first embodiment, the $Al_2O_3$ film 35 as the penetration inhibiting film which blocks the penetration of hydrogen and moisture is formed over the entire surface.

Then, as shown in FIG. 3C, the opening 36 to expose a portion of the Al wiring 30 is formed in the $Al_2O_3$ film 35. Then, the polyimide layer 37 is formed, and the opening 38 to expose the opening 36 is formed in the polyimide layer 37. The portion of the Al wiring 30 exposed from the openings 38 and 36 is used as a pad. Incidentally, also in this embodiment, as shown in FIG. 13, FIG. 14A, and FIG. 14B, the $Al_2O_3$ film 35 is formed in the region other than the PAD opening portions.

Thus, the ferroelectric memory including the ferroelectric capacitor is completed.

Also in the aforementioned second embodiment, the same effect as in the first embodiment can be obtained.

Third Embodiment

Figure 4:
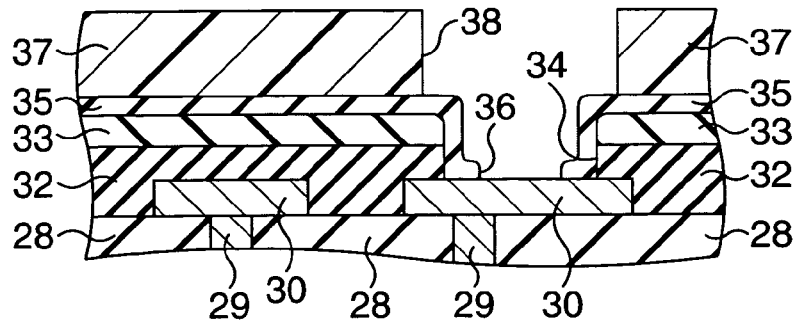
FIG. 4 is a sectional view showing a manufacturing method of a ferroelectric memory according to a third embodiment of the present invention.

Next, the third embodiment of the present invention will be described. Note that here, for convenience, a cross-sectional structure of a semiconductor device will be described with a manufacturing method thereof. FIG. 4 is a sectional view showing a manufacturing method of a ferroelectric memory (semiconductor device) according to the third embodiment of the present invention step by step.

In the third embodiment, first, as shown in FIG. 4, a series of processing steps until the formation of the silicon oxide film 32 is performed in the same manner as in the first embodiment. Then, the silicon oxide film 32 is planarized by a CMP method or the like. Subsequently, the silicon nitride film 33 is formed on the silicon oxide film 32.

Thereafter, similarly as shown in FIG. 4, the opening 34 to expose a portion of the Al wiring 30 is formed in the silicon oxide film 32 and the silicon nitride film 33. Then, the $Al_2O_3$ film 35 as the penetration inhibiting film which blocks the penetration of hydrogen and moisture is formed over the entire surface.

Subsequently, similarly as shown in FIG. 4, the opening 36 to expose a portion of the Al wiring 30 is formed in the $Al_2O_3$ film 35. Thereafter, the polyimide layer 37 is formed, and the opening 38 to expose the opening 36 is formed in the polyimide layer 37. The portion of the Al wiring 30 exposed from the openings 38 and 36 is used as a pad. Incidentally, also in this embodiment, as shown in FIG. 13, FIG. 14A, and FIG. 14B, the $Al_2O_3$ film 35 is formed in the region other than the PAD opening portions.

Thus, the ferroelectric memory including the ferroelectric capacitor is completed.

Also in the aforementioned third embodiment, the same effect as in the first embodiment can be obtained.

Fourth Embodiment

Figure 5A:
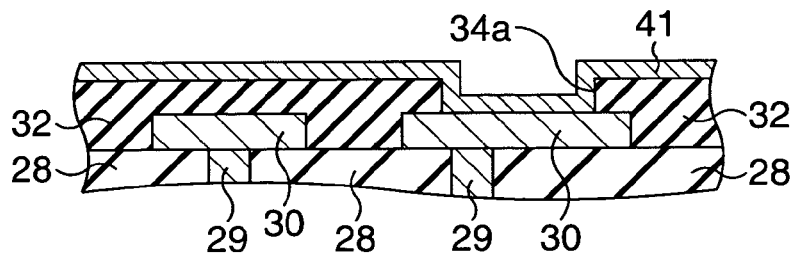
FIG. 5A to FIG. 5C are sectional views showing a manufacturing method of a ferroelectric memory according to a fourth embodiment of the present invention step by step.
Figure 5B:
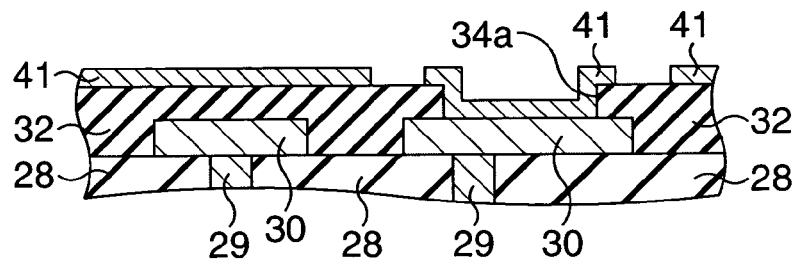
Figure 5C:
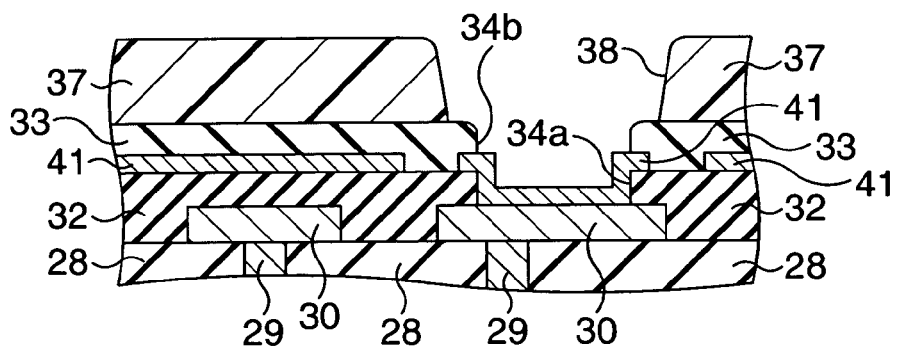

Next, the fourth embodiment of the present invention will be described. Note that here, for convenience, a cross-sectional structure of a semiconductor device will be described with a manufacturing method thereof. FIG. 5A to FIG. 5C are sectional views showing a manufacturing method of a ferroelectric memory (semiconductor device) according to the fourth embodiment of the present invention step by step.

In the fourth embodiment, first, as shown in FIG. 5A, a series of processing steps until the planarization of the silicon oxide film 32 is performed in the same manner as in the third embodiment. Then, an opening 34a to expose a portion of the Al wiring 30 is formed in the silicon oxide film 32. Subsequently, a TiN film 41 is formed as a conductive film over the entire surface. The thickness of the TiN film 41 is, for example, approximately between 50 nm and 200 nm.

Thereafter, as shown in FIG. 5B, the TiN film 41 is patterned. In this patterning, the TiN film 41 is processed in such a manner that an outer edge of a piece of the TiN film 41 which contacts the Al wiring 30 is located inside an outer edge of the Al wiring 30 in plan view. Namely, the portion of the TiN film 41 which contacts the Al wiring 30 is left as an island. Moreover, a portion other than this portion needs to be left as wide as possible within a range in which a short circuit between the portion and the portion as an island does not occur.

Then, as shown in FIG. 5C, the silicon nitride film 33 is formed over the entire surface. Subsequently, an opening 34b to expose the portion of the TiN film which contacts the Al wiring 30 is formed in the silicon nitride film 33. Thereafter, the polyimide layer 37 is formed, and the opening 38 to expose the opening 34b is formed in the polyimide layer 37. A portion of a stacked body of the TiN film 41 and the Al wiring 30 exposed from the openings 38 and 34b is used as a pad.

Thus, the ferroelectric memory including the ferroelectric capacitor is completed.

In the aforementioned fourth embodiment, the TiN film 41 functions as the penetration inhibiting film which blocks the penetration of hydrogen and moisture. In other words, the portion of the TiN film 41 which contacts the Al wiring 30 inhibits the penetration of moisture and so on from the opening for the pad. Moreover, a portion of the TiN film 41 which does not contact the Al wiring 30 inhibits the diffusion of moisture and so on, which penetrate from the surface of the ferroelectric memory, into the inside. Accordingly, as in the first embodiment, deterioration in the characteristics of the ferroelectric capacitor accompanying oxygen deficiency and the like can be inhibited.

Figure 15A:
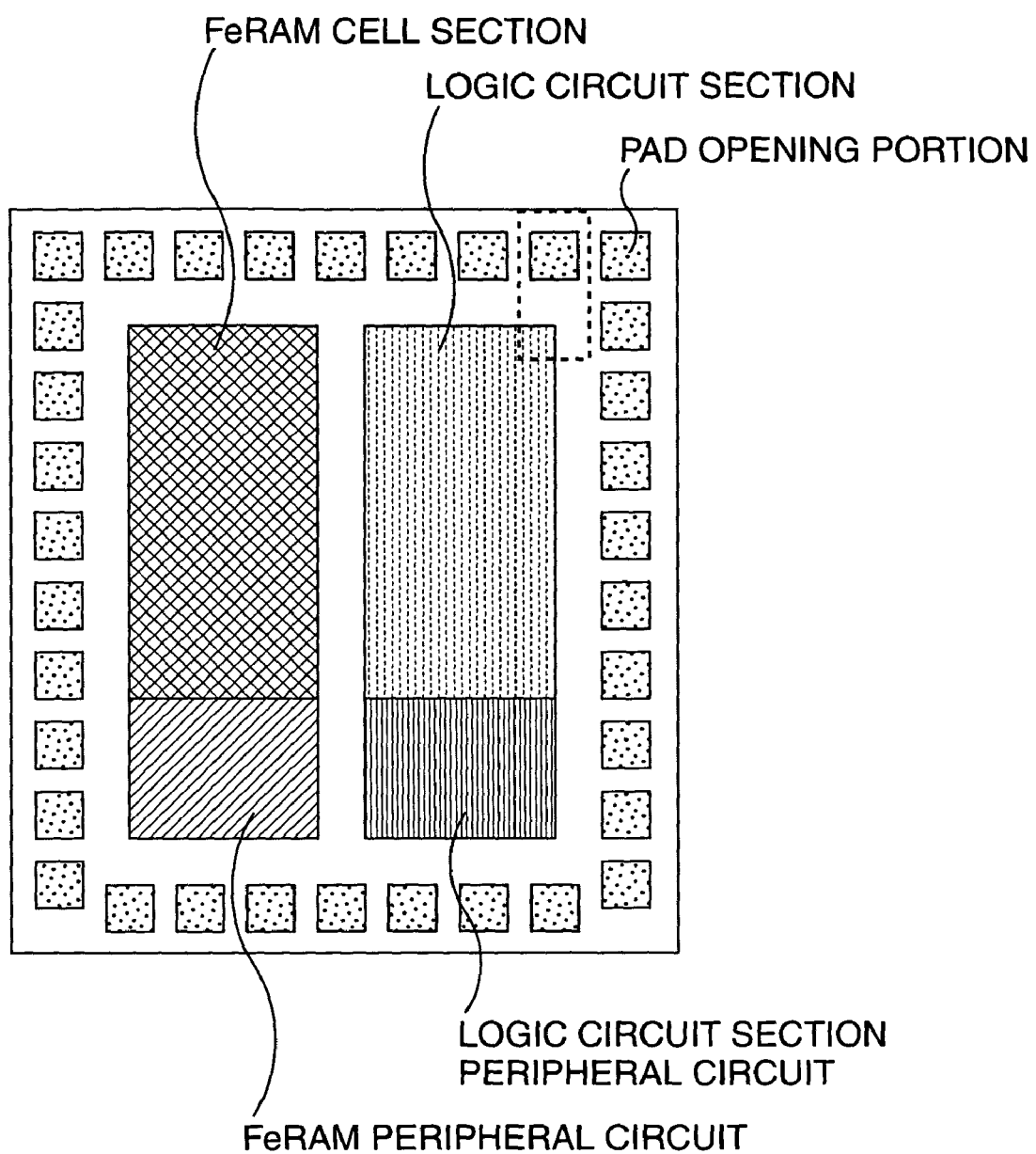
FIG. 15A is a diagram showing a layout of a semiconductor device according to the embodiments of the present invention.
Figure 15B:
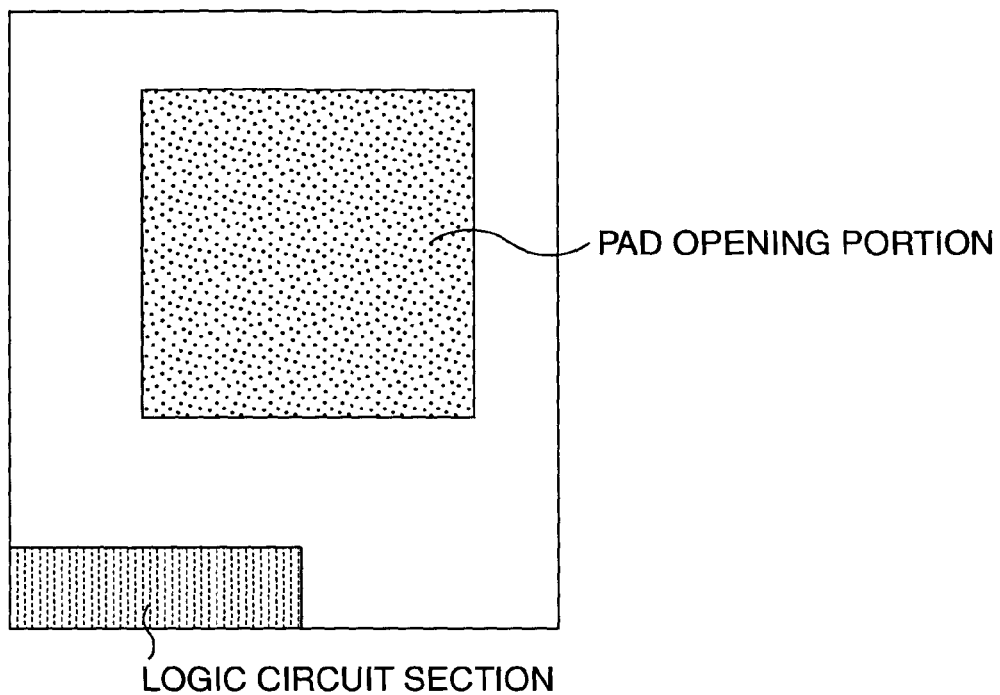
FIG. 15B is an enlarged view showing a region enclosed by a broken line in FIG. 15A.
Figure 15C:
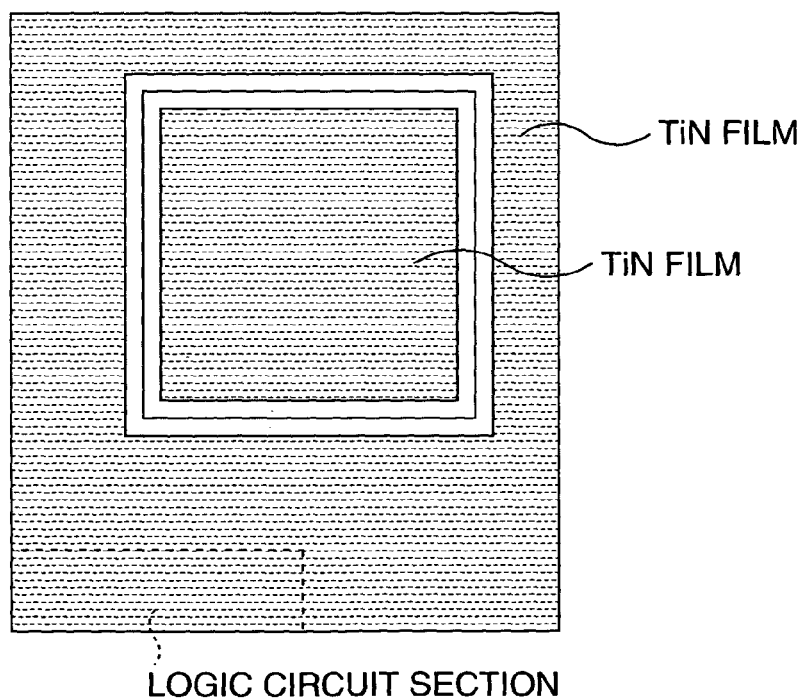
FIG. 15C is a diagram showing a layout of a TiN film 41 in the region shown in FIG. 15B.

Namely, in this embodiment, as shown in FIG. 15A, FIG. 15B, FIG. 15C, and FIG. 16, the TiN film 41 is formed in a region except the vicinity of each of the PAD opening portions. FIG. 15B is an enlarged view showing a region enclosed by a broken line in FIG. 15A, and FIG. 15C is a diagram showing the layout of the TiN film 41 in the region shown in FIG. 15B. Incidentally, in this embodiment, the TiN film 41 is exposed in a topmost surface, but in this structure, when a probe is placed in a test process, there is a possibility that the probe slips. Therefore, it is desirable to form a thin film containing Al on the TiN film 41. Further, a stacked body of a TiN film and a film containing Al may be formed.

Fifth Embodiment

Figure 6A:
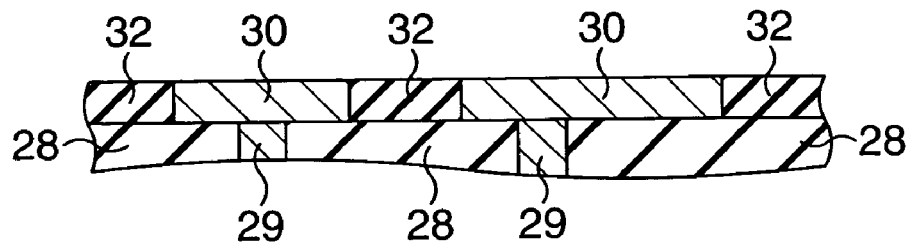
FIG. 6A to FIG. 6C are sectional views showing a manufacturing method of a ferroelectric memory according to a fifth embodiment of the present invention step by step.
Figure 6B:
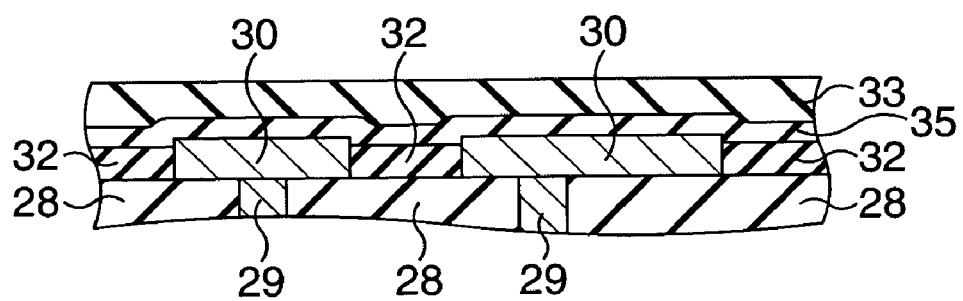
Figure 6C:
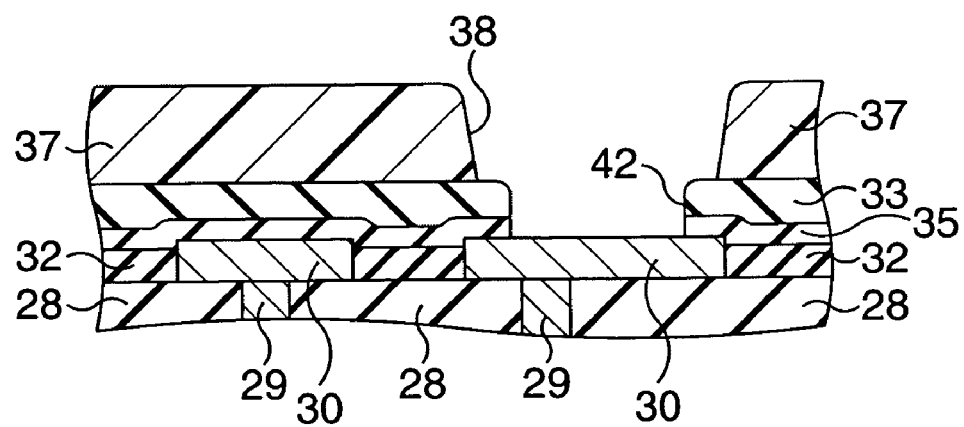

Next, the fifth embodiment of the present invention will be described. Note that here, for convenience, a cross-sectional structure of a semiconductor device will be described with a manufacturing method thereof. FIG. 6A to FIG. 6C are sectional views showing a manufacturing method of a ferroelectric memory (semiconductor device) according to the fifth embodiment of the present invention step by step.

In the fifth embodiment, first, as shown in FIG. 6A, a series of processing steps until the formation of the Al wiring 30 is performed in the same manner as in the first embodiment. Then, the silicon oxide film 32 is formed. Subsequently, the silicon oxide film 32 is planarized until the Al wiring 30 is exposed.

Thereafter, as shown in FIG. 6B, by etching back the silicon oxide film 32, the surface of the silicon oxide film 32 is made lower than the surface of the Al wiring 30. Then, as the penetration inhibiting film which blocks the penetration of hydrogen and moisture, the $Al_2O_3$ film 35 is formed over the entire surface of the chip. Further, the silicon nitride film 33 is formed on the $Al_2O_3$ film 35.

Subsequently, as shown in FIG. 6C, an opening 42 to expose a portion of the Al wiring 30 is formed in the silicon nitride film 33 and the $Al_2O_3$ film 35. Thereafter, the polyimide layer 37 is formed, and the opening 38 to expose the opening 42 is formed in the polyimide layer 37. The portion of the Al wiring 30 exposed from the openings 38 and 42 is used as a pad. Incidentally, also in this embodiment, as shown in FIG. 13, FIG. 14A, and FIG. 14B, the $Al_2O_3$ film 35 is formed in the region other than the PAD opening portions.

Thus, the ferroelectric memory including the ferroelectric capacitor is completed.

Also in the aforementioned fifth embodiment, the same effect as in the first embodiment can be obtained.

Incidentally, the etch-back of the silicon nitride film 32 is not necessarily required, but when etch-back is done, the penetration of moisture and so on becomes more difficult, so that etch-back is desirable.

Sixth Embodiment

Next, the sixth embodiment of the present invention will be described. Note that here, for convenience, a cross-sectional structure of a semiconductor device will be described with a manufacturing method thereof. FIG. 7A to FIG. 7H are sectional views showing a manufacturing method of a ferroelectric memory (semiconductor device) according to the sixth embodiment of the present invention step by step.

Figure 7A:
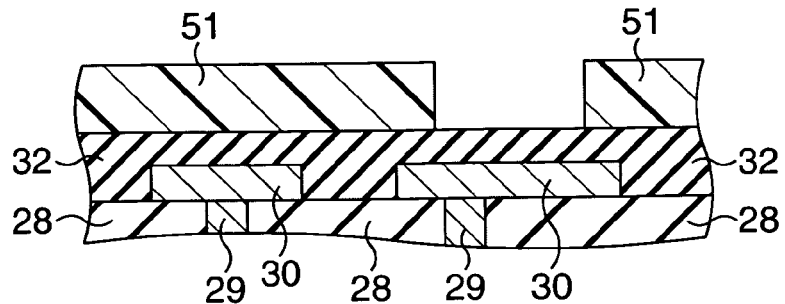
FIG. 7A to FIG. 7H are sectional views showing a manufacturing method of a ferroelectric memory according to a sixth embodiment of the present invention step by step.

In the sixth embodiment, first, as shown in FIG. 7A, a series of processing steps until the planarization of the silicon oxide film 32 is performed in the same manner as in the third embodiment. Then, a resist pattern 51 having an opening which matches a portion of the Al wiring 30 in plan view is formed on the silicon oxide film 32.

Figure 7B:
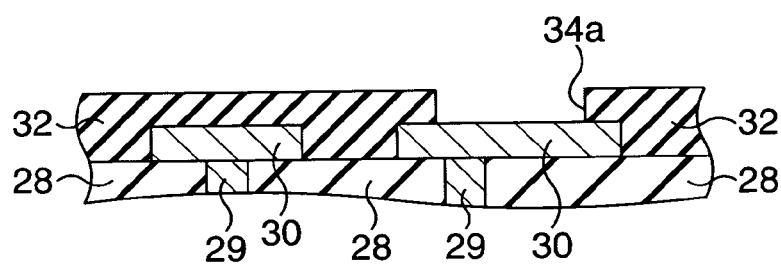

Subsequently, as shown in FIG. 7B, by anisotropic etching of the silicon oxide film 32 using the resist pattern 51, the opening 34a to expose the portion of the Al wiring 30 is formed in the silicon oxide film 32. Thereafter, the resist pattern 51 is removed. Then, the silicon oxide film 32 is annealed in an $N_2$ atmosphere. By this annealing, the silicon oxide film 32 is degassed and the surface of the silicon oxide film 32 is nitrided, which makes moisture absorption difficult. Also in the first to sixth embodiments, it is desirable to perform the same annealing. This annealing may be omitted.

Figure 7C:
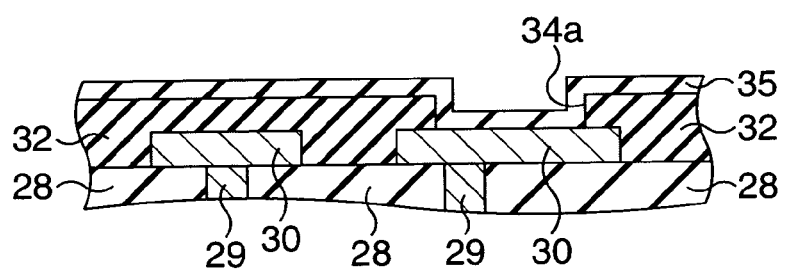

Then, as shown in FIG. 7C, as the penetration inhibiting film which blocks the penetration of hydrogen and moisture, the $Al_2O_3$ film 35 is formed over the entire surface of the chip.

Figure 7D:
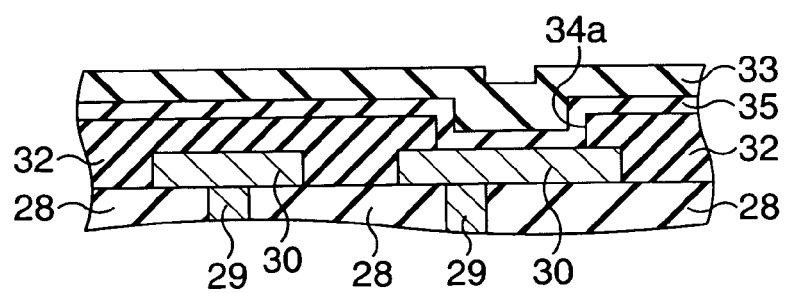

Subsequently, as shown in FIG. 7D, the silicon nitride film 33 is formed on the $Al_2O_3$ film 35.

Figure 7E:
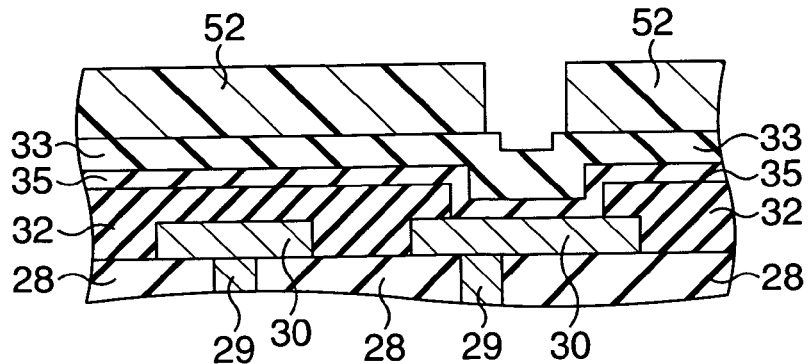

Thereafter, as shown in FIG. 7E, a resist pattern 52 having an opening formed inside the opening 34a in plan view is formed on the silicon nitride film 33.

Figure 7F:
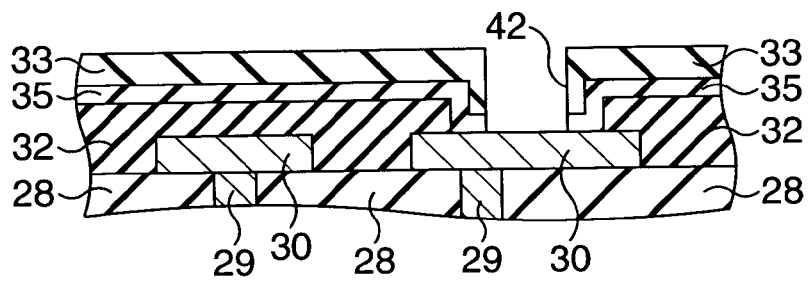

Then, as shown in FIG. 7F, by anisotropic etching of the silicon nitride film 33 and the $Al_2O_3$ film 35 using the resist pattern 52, the opening 42 to expose a portion of the Al wiring 30 is formed in the silicon nitride film 33 and the $Al_2O_3$ film 35. Subsequently, the resist pattern 52 is removed.

Figure 7G:
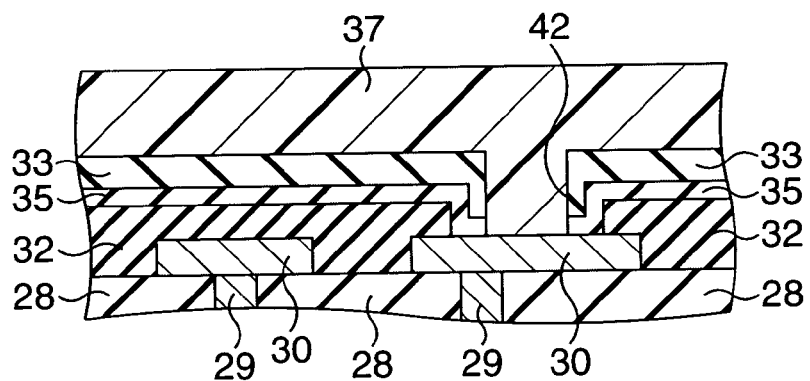
Figure 7H:
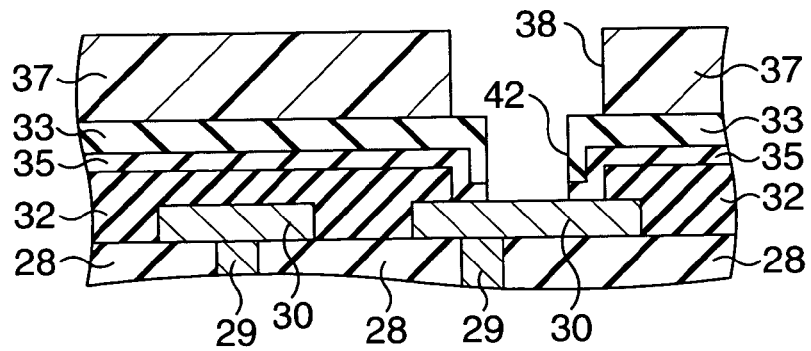

Thereafter, as shown in FIG. 7G, the polyimide layer 37 is formed. Then, as shown in FIG. 7H, the opening 38 to expose the opening 42 is formed in the polyimide layer 37. The portion of the Al wiring 30 exposed from the openings 38 and 42 is used as a pad. Incidentally, also in this embodiment, as shown in FIG. 13, FIG. 14A, and FIG. 14B, the $Al_2O_3$ film 35 is formed in the region other than the PAD opening portions.

Thus, the ferroelectric memory including the ferroelectric capacitor is completed.

Also in the aforementioned sixth embodiment, the same effect as in the first embodiment can be obtained. Incidentally, as in the second embodiment, it is also possible to form the opening 34a by isotropic etching and perform sputtering etching in the Ar atmosphere.

Seventh Embodiment

Next, the seventh embodiment of the present invention will be described. Note that here, for convenience, a cross-sectional structure of a semiconductor device will be described with a manufacturing method thereof. FIG. 8A to FIG. 8I are sectional views showing a manufacturing method of a ferroelectric memory (semiconductor device) according to the seventh embodiment of the present invention step by step.

Figure 8A:
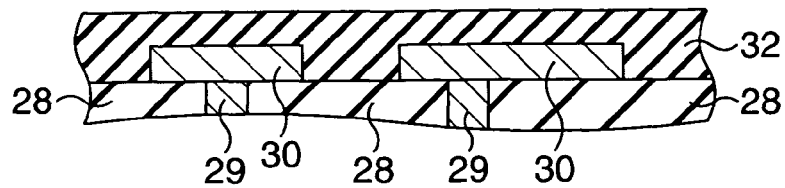
FIG. 8A to FIG. 8I are sectional views showing a manufacturing method of a ferroelectric memory according to a seventh embodiment of the present invention step by step.
Figure 8B:
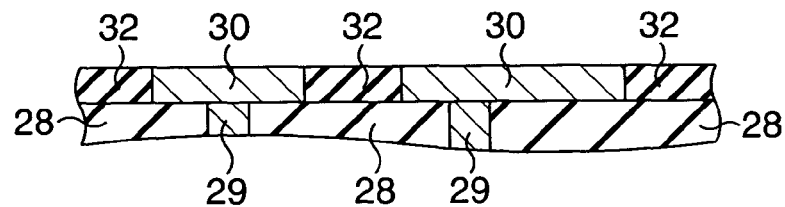

In the seventh embodiment, first, as shown in FIG. 8A, a series of processing steps until the formation of the silicon oxide film 32 is performed in the same manner as in the first embodiment. Then, as shown in FIG. 8B, the silicon oxide film 32 is planarized until the Al wiring 30 is exposed.

Figure 8C:
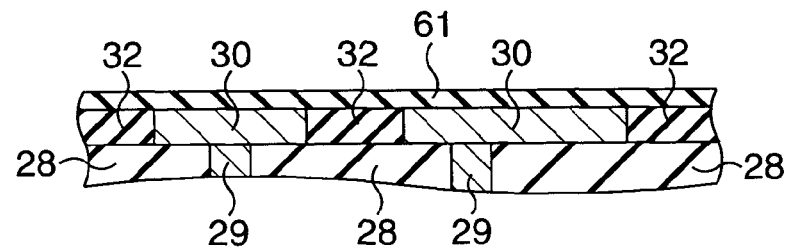
Figure 8D:
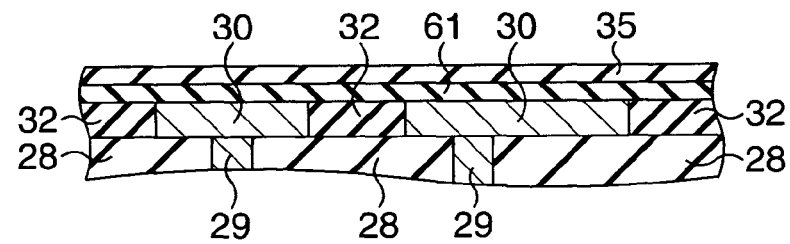

Subsequently, as shown in FIG. 8C, a silicon nitride film 61 is formed over the entire surface. The thickness of the silicon nitride film 61 is, for example, approximately between 50 nm and 300 nm. Thereafter, as shown in FIG. 8D, as the penetration inhibiting film which blocks the penetration of hydrogen and moisture, the $Al_2O_3$ film 35 is formed over the entire surface of silicon nitride film 61.

Figure 8E:
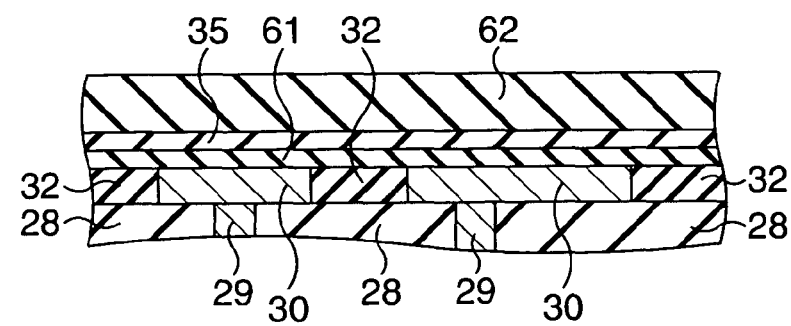
Figure 8F:
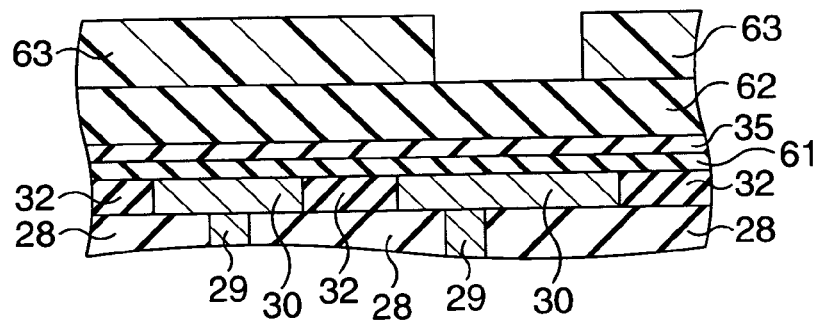

Then, as shown in FIG. 8E, a silicon nitride film 62 is formed on the $Al_2O_3$ film 35. The thickness of the silicon nitride film 62 is, for example, approximately between 100 nm and 1000 nm. Subsequently, as shown in FIG. 8F, a resist pattern 63 having an opening which matches a portion of the Al wiring 30 in plan view is formed on the silicon nitride film 62.

Figure 8G:
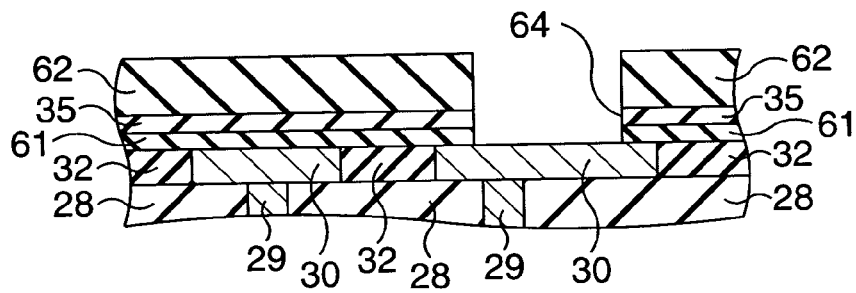

Thereafter, as shown in FIG. 8G, by anisotropic etching of the silicon nitride film 62, the $Al_2O_3$ film 35, and the silicon nitride film 61 using the resist pattern 63, an opening 64 to expose the portion of the Al wiring 30 is formed in the silicon nitride film 62, the $Al_2O_3$ film 35, and the silicon nitride film 61. Then, the resist pattern 63 is removed.

Figure 8H:
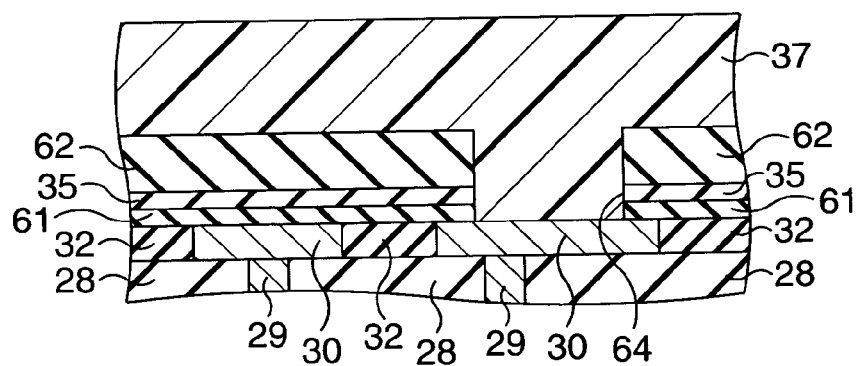
Figure 8I:
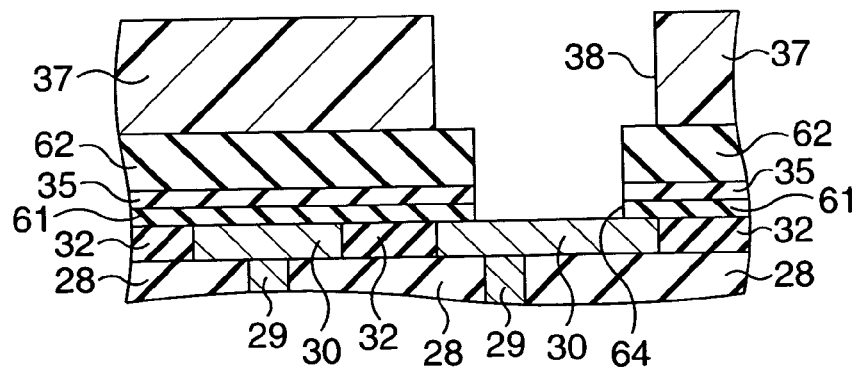

Subsequently, as shown in FIG. 8H, the polyimide layer 37 is formed. Thereafter, the opening 38 to expose the opening 64 is formed in the polyimide layer 37. The portion of the Al wiring 30 exposed from the openings 38 and 64 is used as a pad. Incidentally, also in this embodiment, as shown in FIG. 13, FIG. 14A, and FIG. 14B, the $Al_2O_3$ film 35 is formed in the region other than the PAD opening portions.

Thus, the ferroelectric memory including the ferroelectric capacitor is completed.

Also in the aforementioned seventh embodiment, the same effect as in the first embodiment can be obtained. Incidentally, the formation of the silicon nitride film 62 may be omitted. Moreover, as in the fifth embodiment, the silicon oxide film 32 may be etched back.

Eighth Embodiment

Next, the eighth embodiment of the present invention will be described. Note that here, for convenience, a cross-sectional structure of a semiconductor device will be described with a manufacturing method thereof. FIG. 9A to FIG. 9J are sectional views showing a manufacturing method of a ferroelectric memory (semiconductor device) according to the eighth embodiment of the present invention step by step.

Figure 9A:
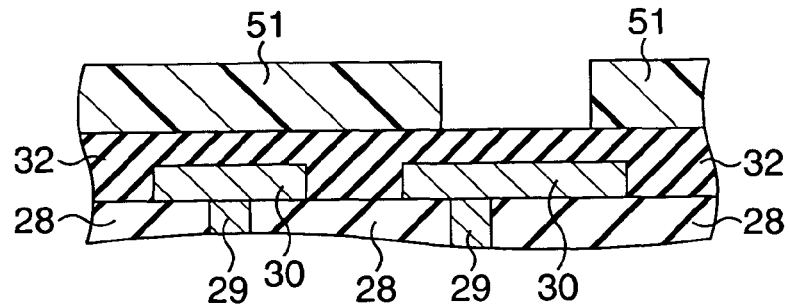
FIG. 9A to FIG. 9J are sectional views showing a manufacturing method of a ferroelectric memory according to an eighth embodiment of the present invention step by step.
Figure 9B:
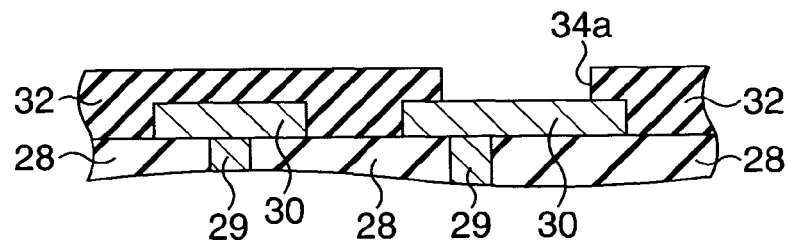

In the eighth embodiment, first, as shown in FIG. 9A, a series of processing steps until the formation of the resist pattern 51 is performed in the same manner as in the sixth embodiment. Then, as shown in FIG. 9B, by anisotropic etching of the silicon oxide film 32 using the resist pattern 51, the opening 34a to expose a portion of the Al wiring 30 is formed in the silicon oxide film 32. Subsequently, the resist pattern 51 is removed. Thereafter, the silicon oxide film 32 is annealed in an $N_2$ atmosphere.

Figure 9C:
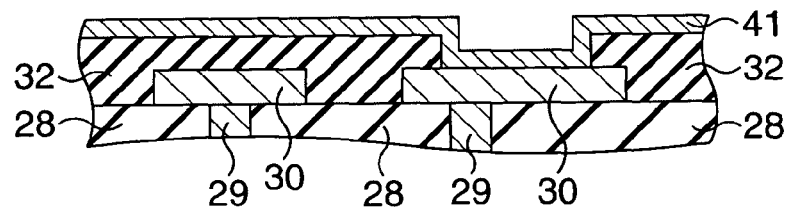
Figure 9D:
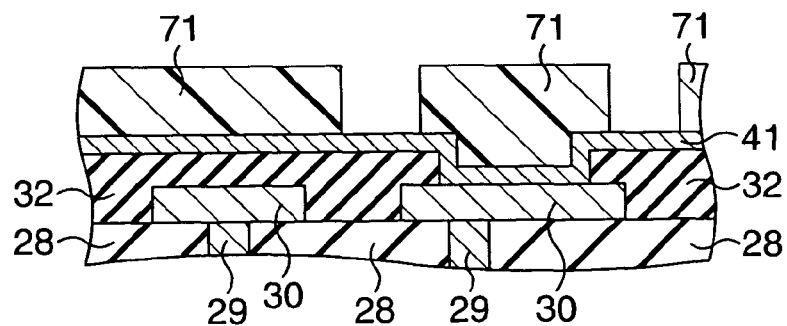

Then, as shown in FIG. 9C, the TiN film 41 as a conductive film is formed over the entire surface as in the fourth embodiment. Subsequently, as shown in FIG. 9D, a resist pattern 71 is formed on the TiN film 41. At this time, used as the resist pattern 71 is a resist pattern in which an opening is formed in such a manner that an outer edge of a portion of the TiN film 41 which contacts the Al wiring 30 is located inside an outer edge of the Al wiring 30 in plan view. In other words, by subsequent etching, the portion of the TiN film 41 which contacts the Al wiring 30 is left as an island. Moreover, a portion other than this portion needs to be covered with the TiN film 41 as wide as possible within a range in which a short circuit between the portion and the portion left as an island does not occur.

Figure 9E:
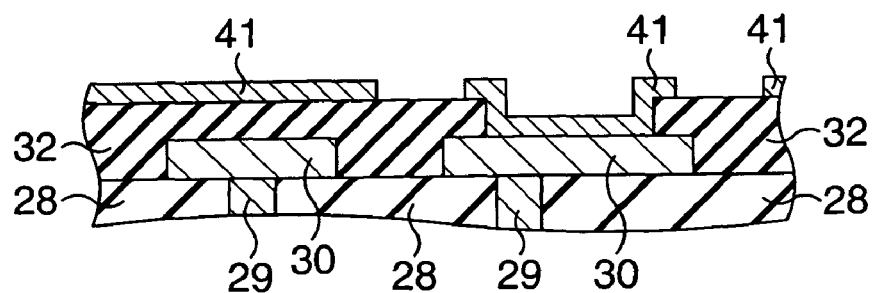

Thereafter, as shown in FIG. 9E, by anisotropic etching of the TiN film 41 using the resist pattern 71, the TiN film 41 is processed into an island-like portion and a portion which covers the silicon oxide film 32.

Figure 9F:
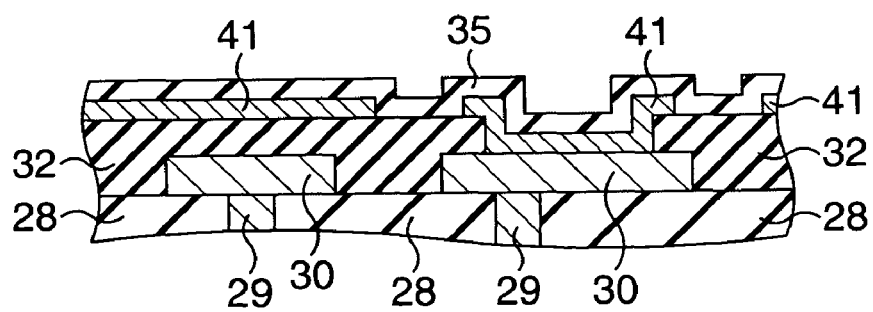
Figure 9G:
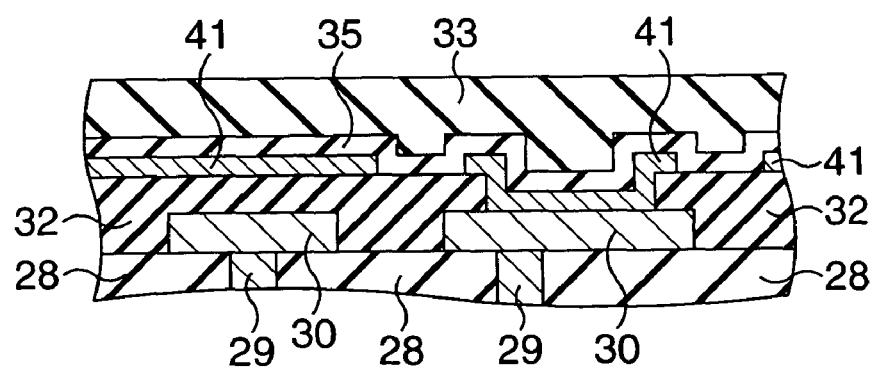

Then, as shown in FIG. 9F, as the penetration inhibiting film which blocks the penetration of hydrogen and moisture, the $Al_2O_3$ film 35 is formed over the entire surface. Subsequently, as shown in FIG. 4I, the silicon nitride film 33 is formed on the $Al_2O_3$ film 35.

Figure 9H:
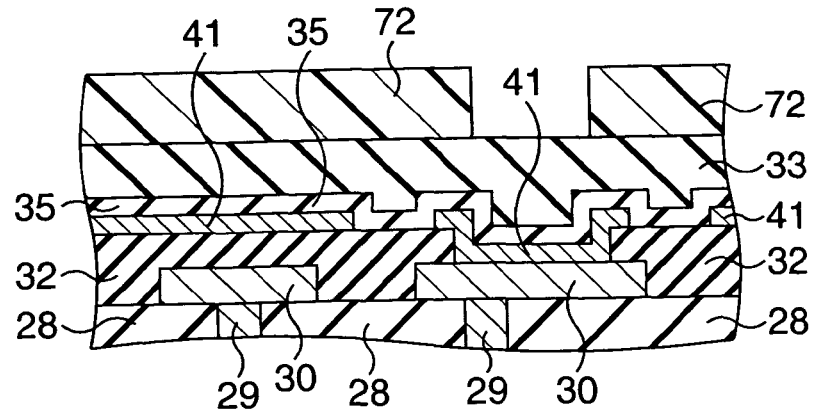
Figure 9I:
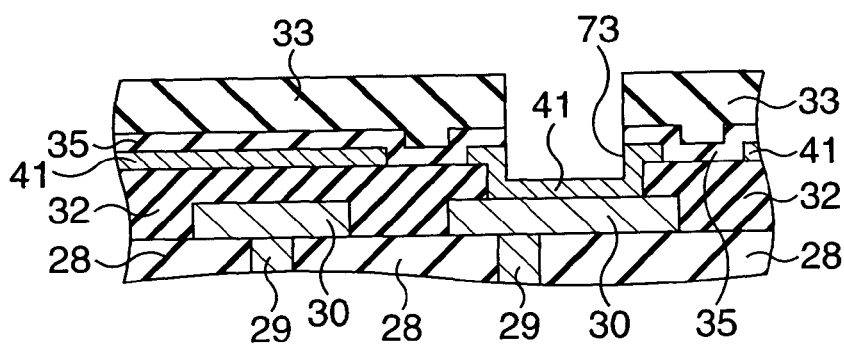

Thereafter, as shown in FIG. 9H, a resist pattern 72 having an opening formed inside the opening 34a in plan view is formed on the silicon nitride film 33. Then, as shown in FIG. 9I, by anisotropic etching of the silicon nitride film 33 and the $Al_2O_3$ film 35 using the resist pattern 72, an opening 73 to expose the portion of the TiN film 41 which contacts the Al wiring 30 is formed. Subsequently, the resist pattern 72 is removed.

Figure 9J:
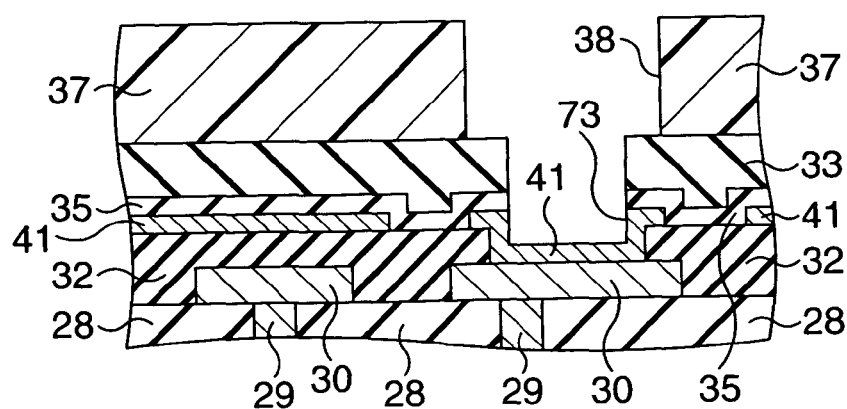

Thereafter, as shown in FIG. 9J, the polyimide layer 37 is formed, and the opening 38 to expose the opening 73 is formed in the polyimide layer 37. A portion of a stacked body of the TiN film 41 and the Al wiring 30 exposed from the openings 38 and 73 is used as a pad. Incidentally, also in this embodiment, as shown in FIG. 13, FIG. 14A, and FIG. 14B, the $Al_2O_3$ film 35 is formed in the region other than the PAD opening portions.

Thus, the ferroelectric memory including the ferroelectric capacitor is completed.

Also in the aforementioned eighth embodiment, the same effect as in the fourth embodiment can be obtained.

Incidentally, in these embodiments, the ferroelectric capacitor has a planar structure, but may have a stacked structure.

Figure 17:
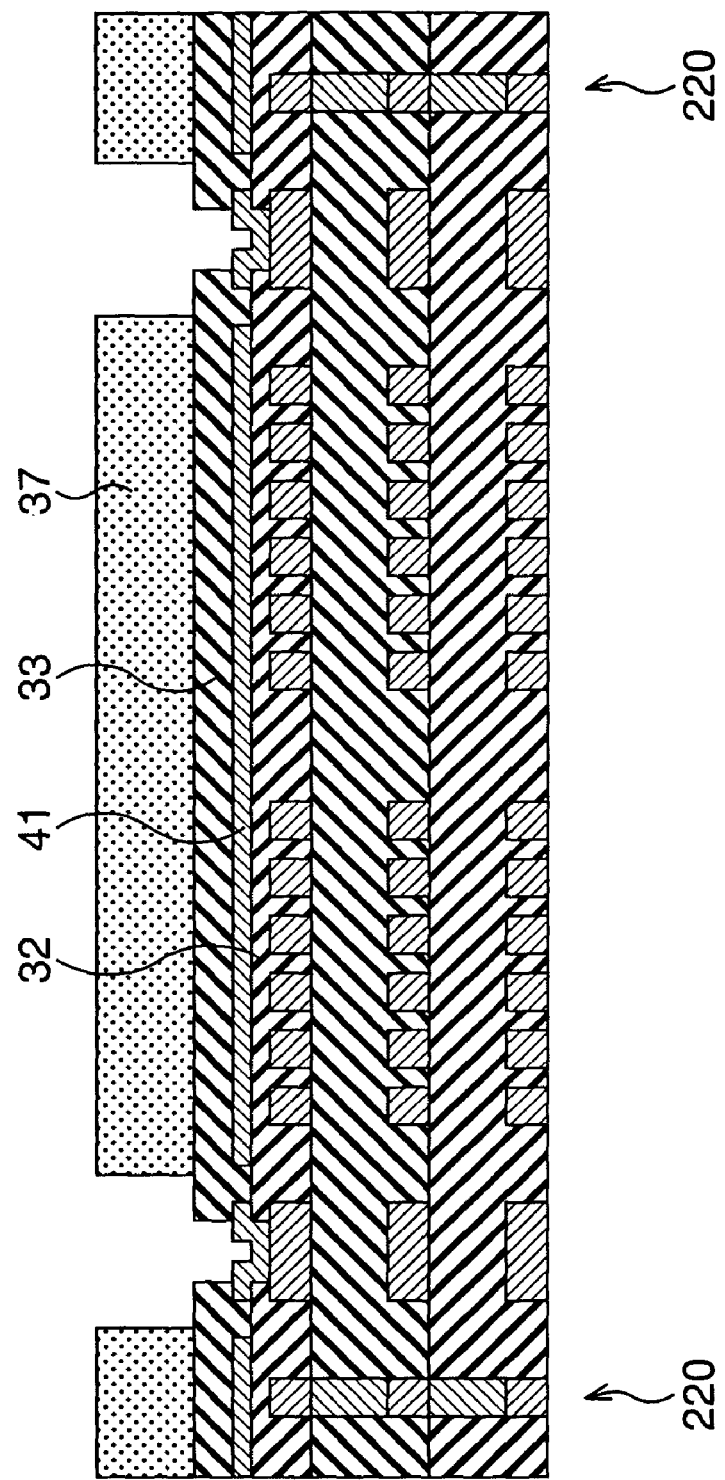
FIG. 17 is a diagram showing a moisture-resistant ring 220.

Moreover, in the first to eighth embodiments, if dicing in the scribe sections 201 and 211 is performed, a side surface of the silicon oxide film 32 is exposed, but since a moisture-resistant ring 220 as a moisture protective film is usually formed inside a scribe line so as to surround the entire chip as shown in FIG. 17, moisture does not penetrate from a side surface of the chip even after dicing. FIG. 17 shows the moisture-resistant ring 220 in the eighth embodiment as an example.

Figure 18A:
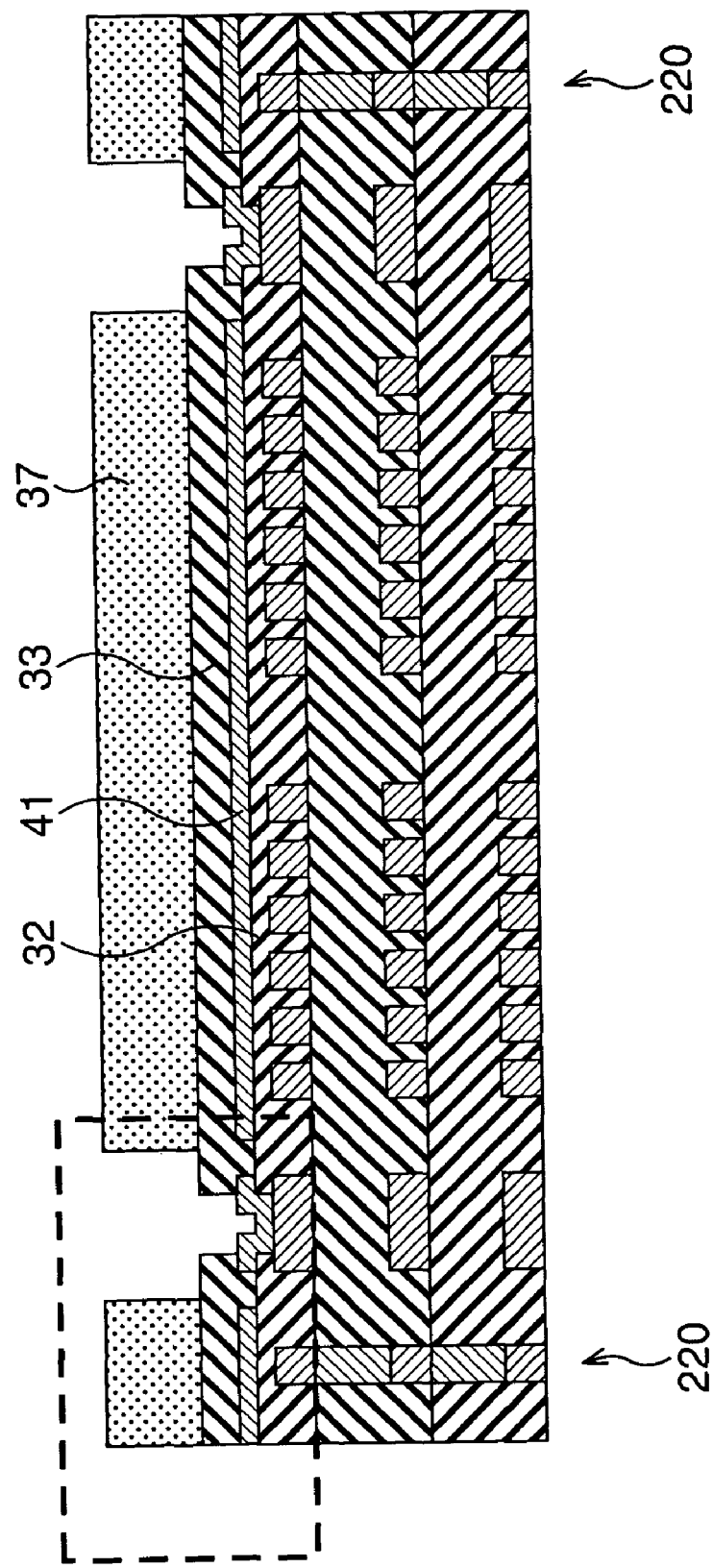
FIG. 18A is a diagram showing the relation between the moisture-resistant ring 220 and the TiN film 41.
Figure 18B:
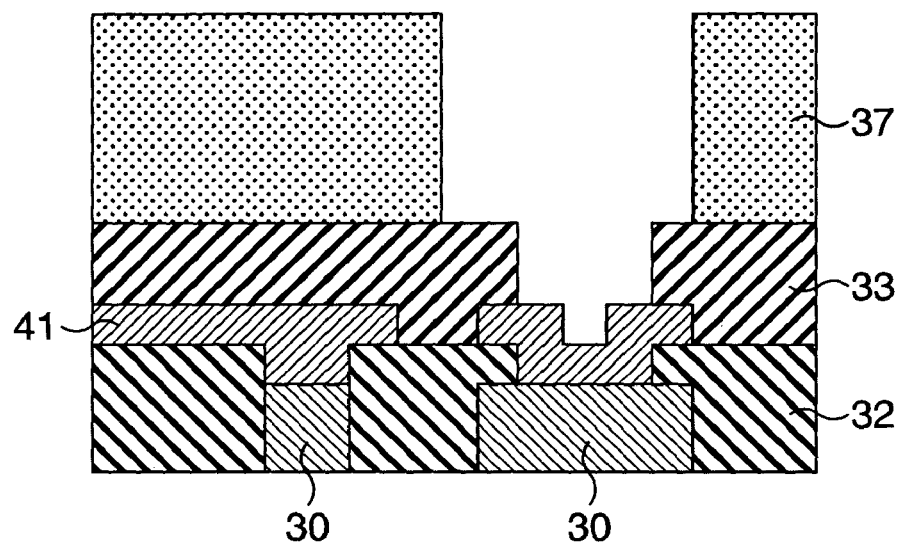
FIG. 18B is an enlarged view showing a region enclosed by a broken line in FIG. 18A.
Figure 19:
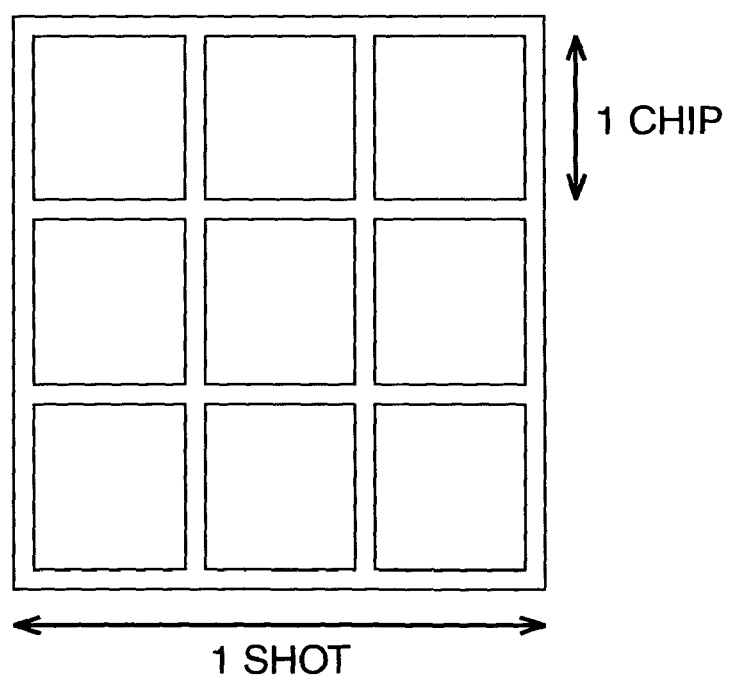
FIG. 19 is a diagram showing a semiconductor circuit on which general logic circuits or ferroelectric capacitors are mounted.
Figure 20:
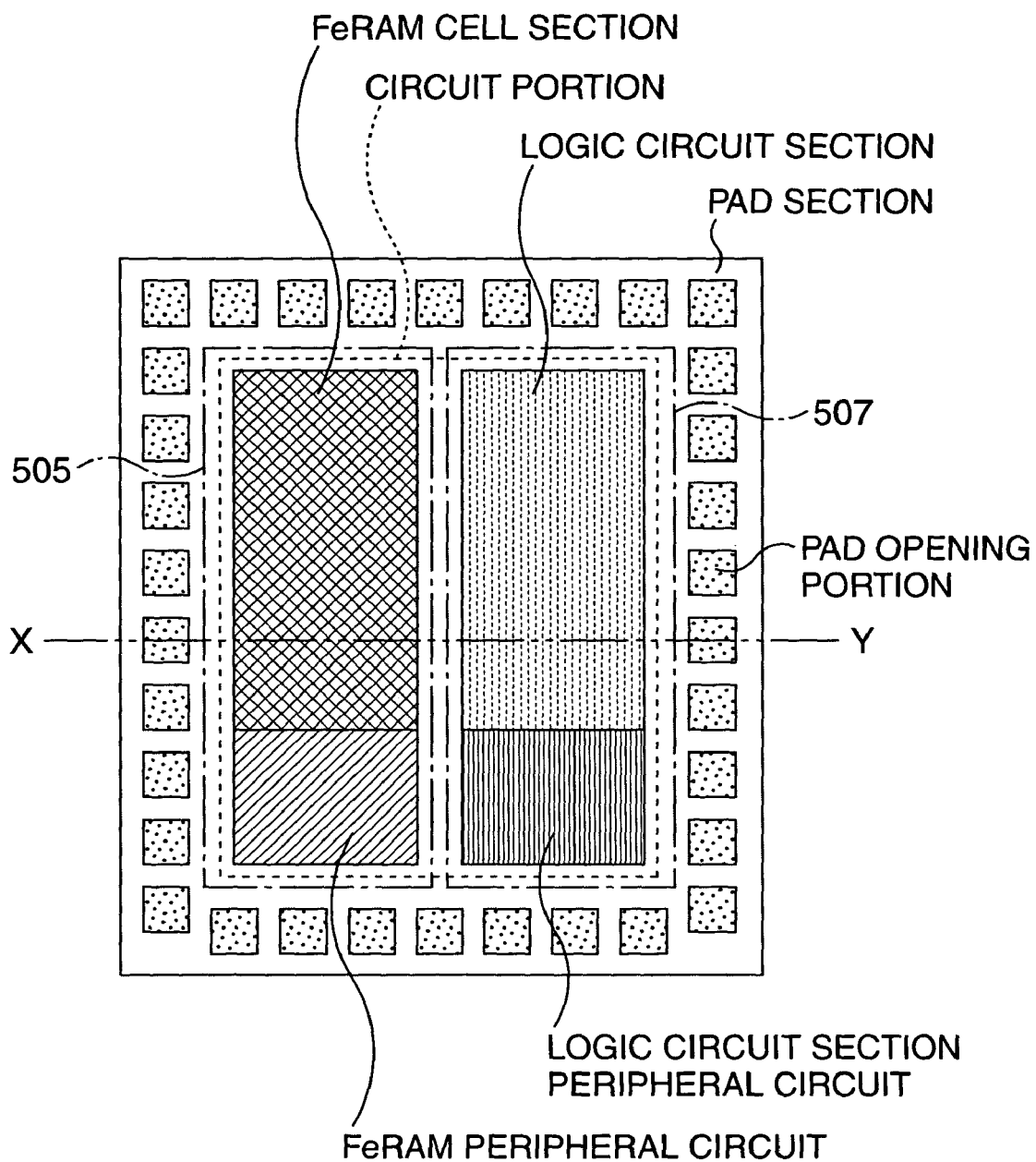
FIG. 20 is a diagram showing a layout of one chip.
Figure 21:
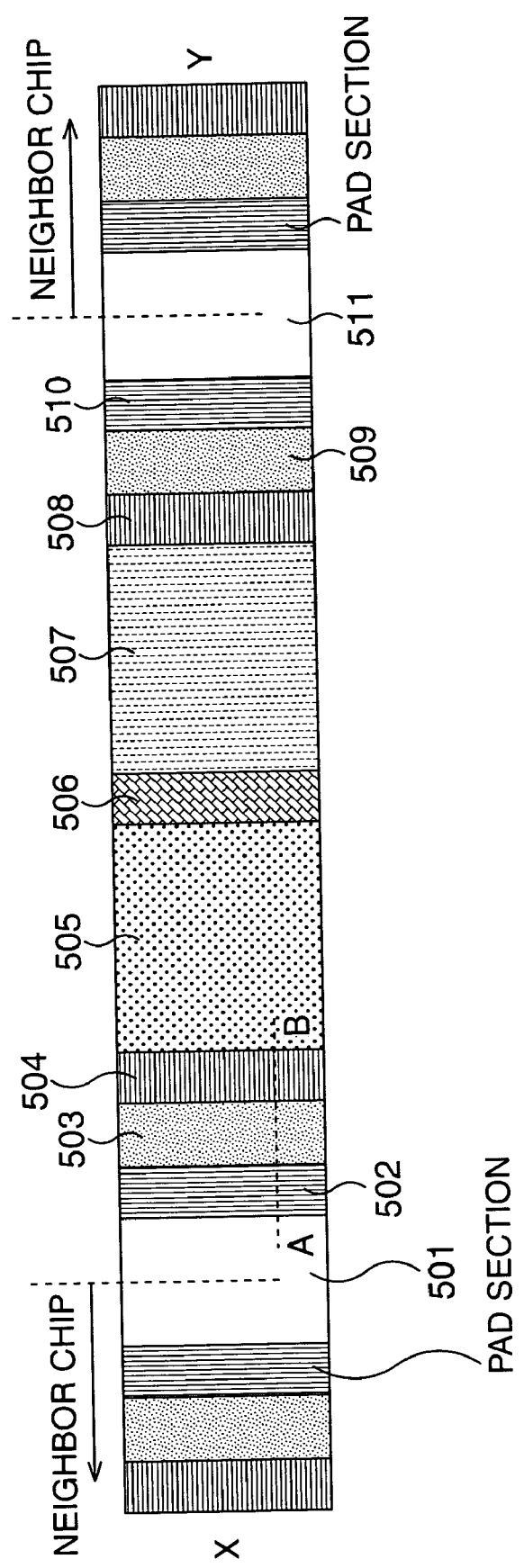
FIG. 21 is a diagram showing a layout of a section taken along the line X-Y in FIG. 20.
Figure 22:
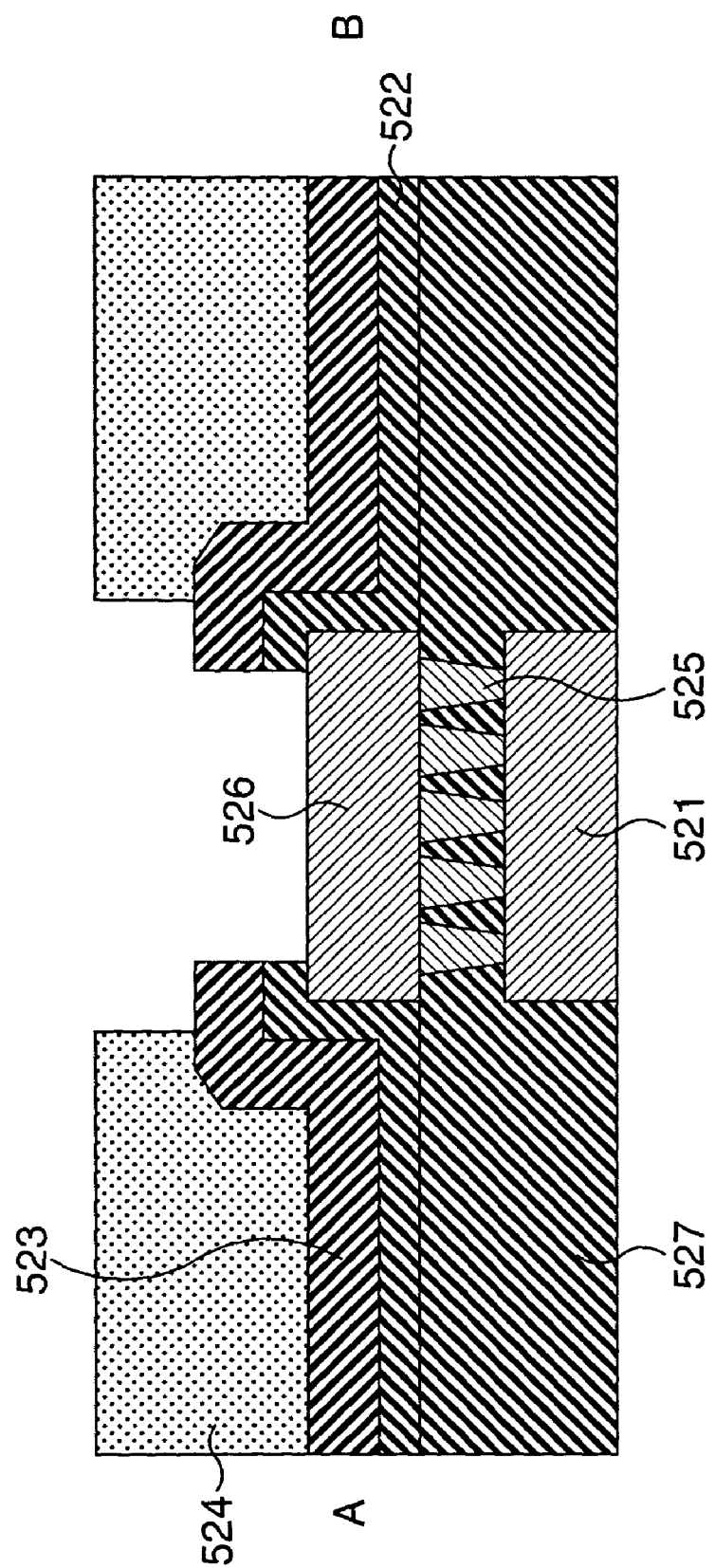
FIG. 22 is a sectional view taken along the line A-B in FIG. 21.
Figure 23:
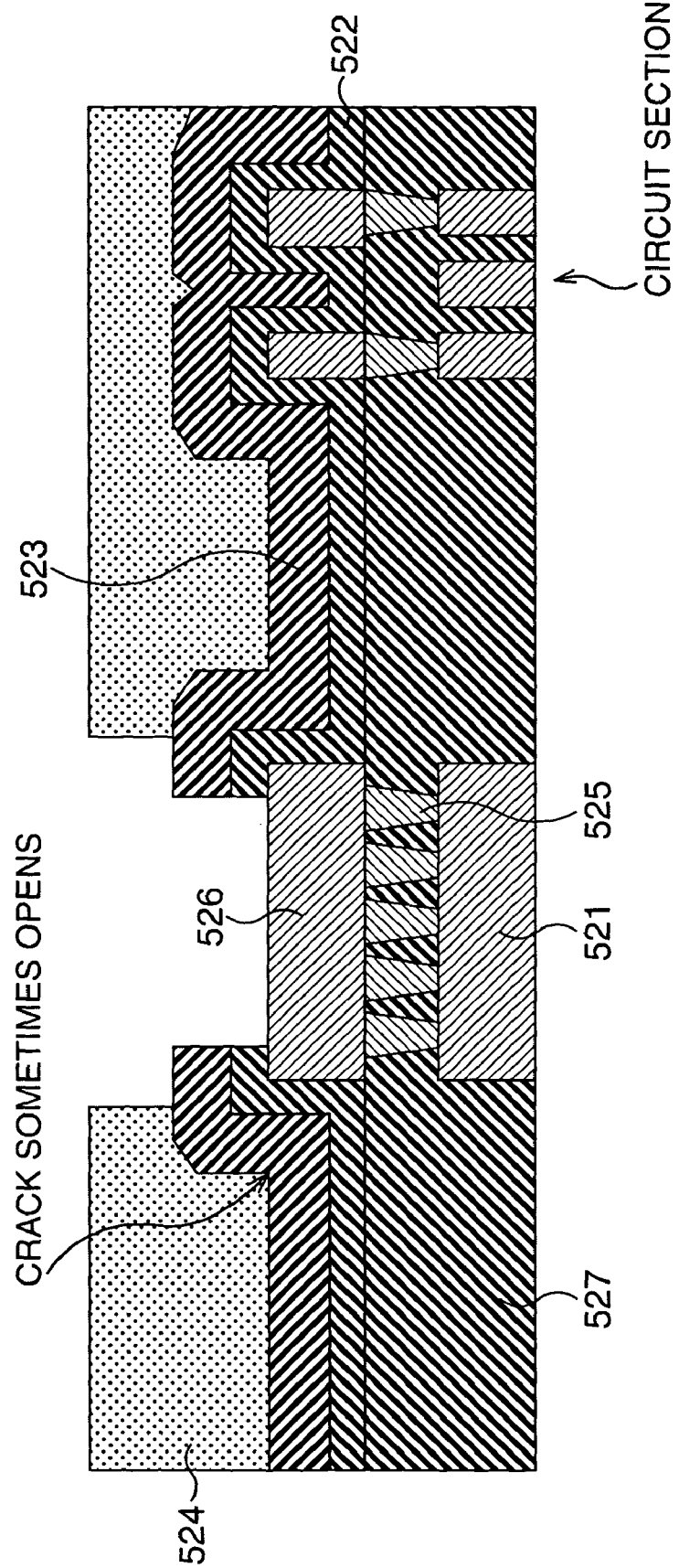
FIG. 23 is a sectional view showing a position where a crack occurs regarding FIG. 22.
Figure 24:
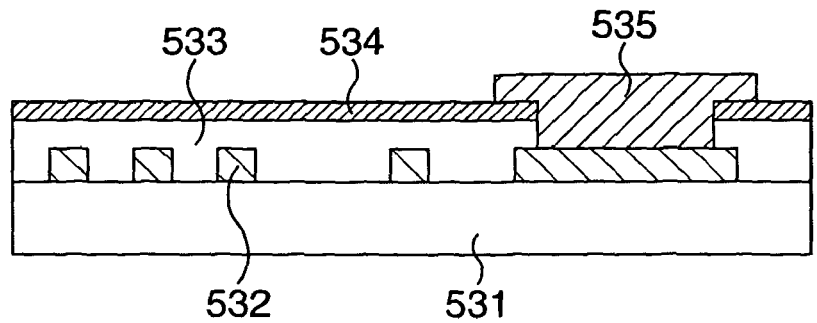
FIG. 24 is a sectional view showing a structure of a semiconductor device described in Patent Document 1.
Figure 25:
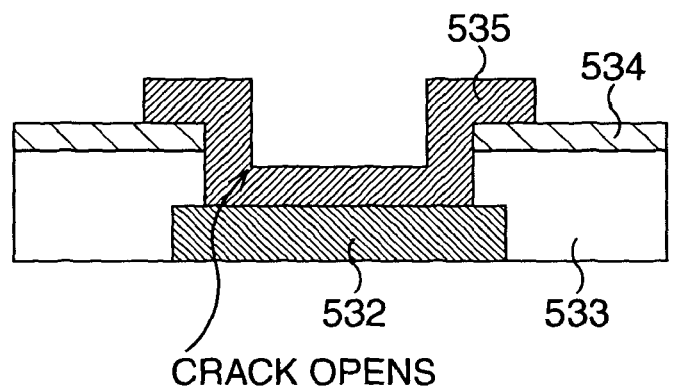
FIG. 25 is a sectional view showing a position where a crack occurs regarding FIG. 24.
Figure 26:
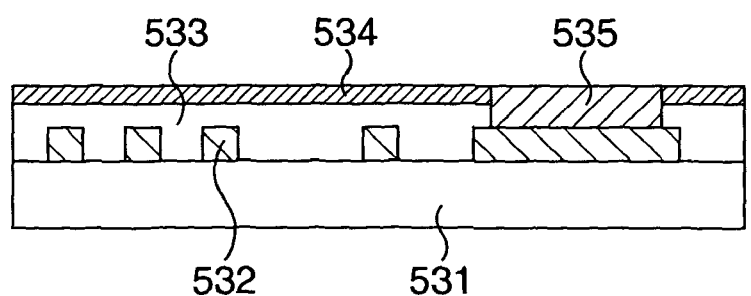
FIG. 26 is a sectional view showing another structure of a semiconductor device described in Patent Document 1.
Figure 27A:
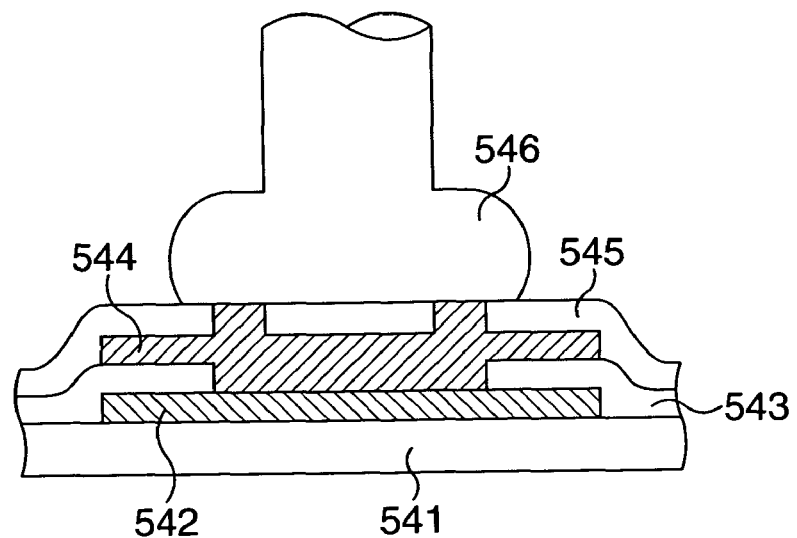
FIG. 27A is a sectional view showing a structure of a semiconductor device described in Patent Document 2.
Figure 27B:
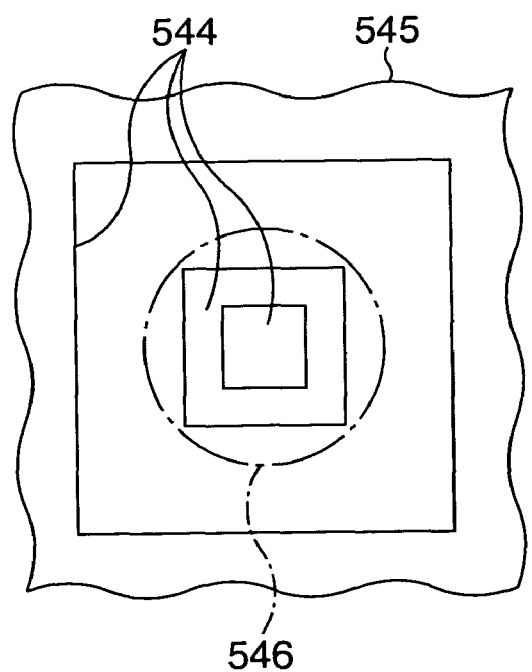
FIG. 27B is a top view showing a structure of the semiconductor device described in Patent Document 2.
Figure 28:
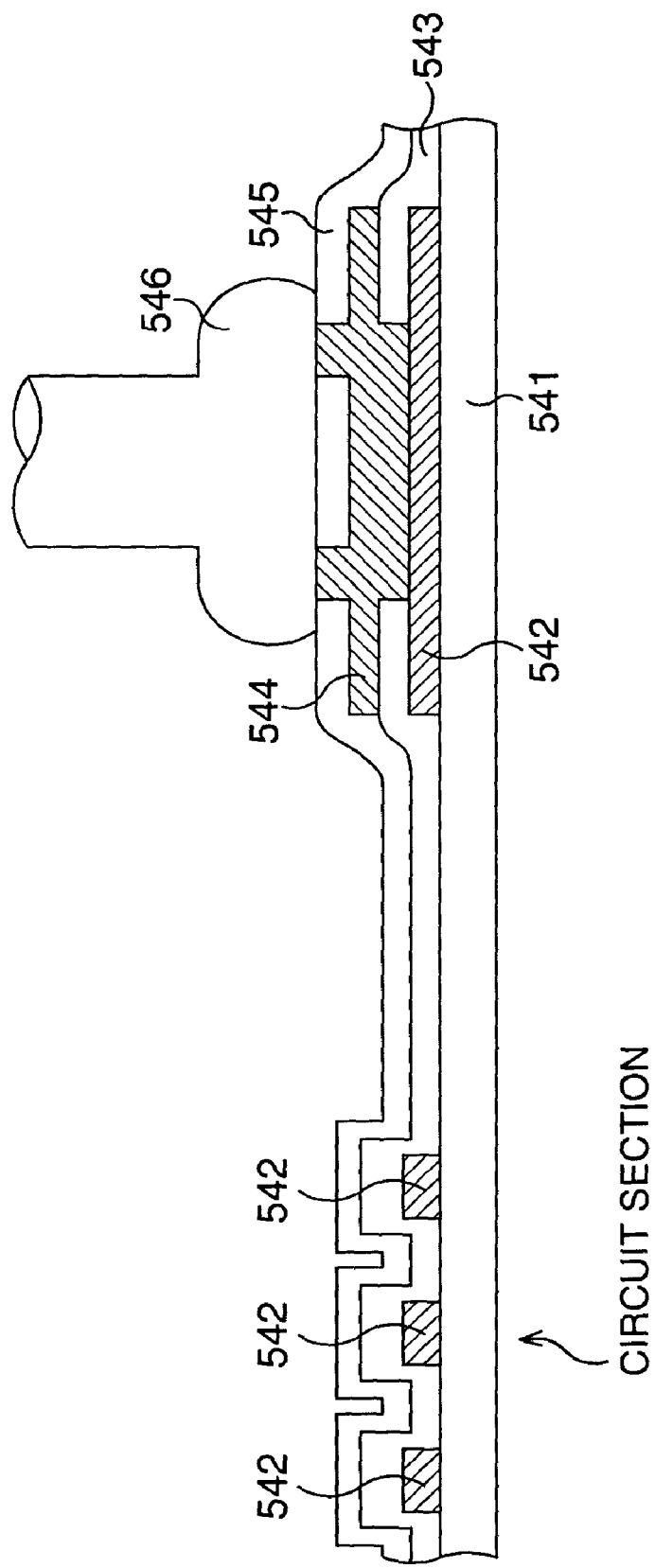
FIG. 28 is a sectional view showing a structure of a circuit section assumed in a semiconductor device described in Patent Document 2.
Figure 29:
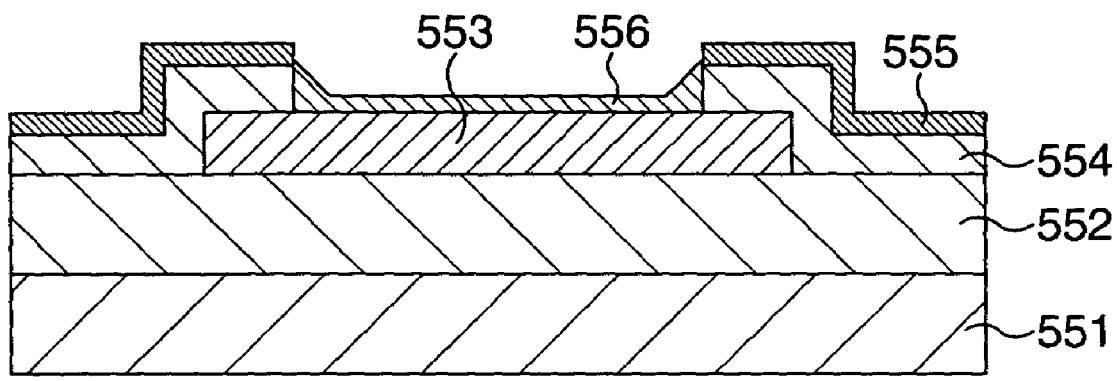
FIG. 29 is a sectional view showing a structure of a semiconductor device described in Patent Document 3.
Figure 30:
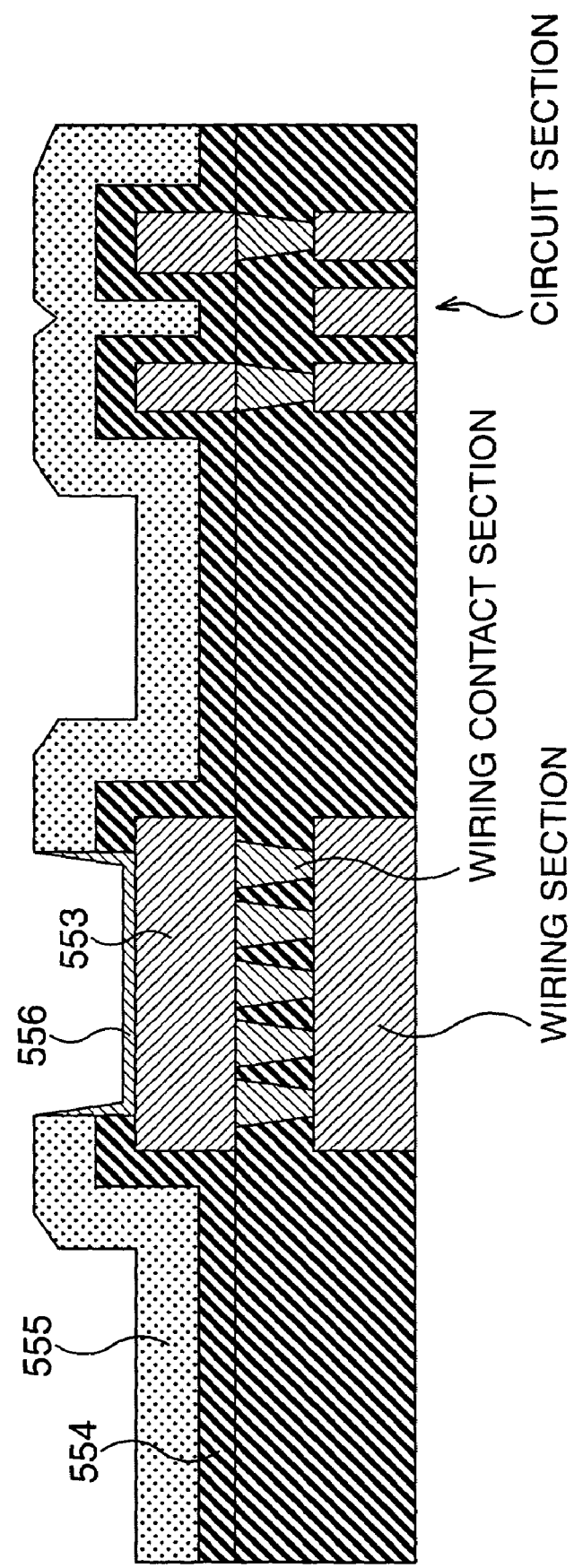
FIG. 30 is a sectional view showing a structure of a circuit section assumed in a semiconductor device described in Patent Document 3.

Further, when a portion of the silicon oxide film 32 outside the moisture-resistant ring 220 connects with a portion thereof inside the moisture-resistant ring 220 as shown in FIG. 18A, the connecting portion may be blocked with the TiN film 41, as shown in FIG. 18B. Such a structure can be realized, for example, in the following manner. Namely, after the Al wiring 30 including the PAD is formed, the silicon oxide film 32 is formed, and portions of the silicon oxide film on the PAD and on the moisture-resistant ring 220 are removed at the same time. Thereafter, the TiN film (or metal film) is formed over the entire surface of the chip, and the TiN film (or metal film) is left only in necessary portions. Such a structure makes it possible to more certainly prevent the penetration of moisture after dicing. Additionally, the penetration of moisture and hydrogen from above is prevented by the TiN film 41.

Furthermore, the type of the semiconductor device is not limited to the ferroelectric memory, and the present invention is also applicable to a DRAM, an SRAM, an LSI, and so on. When the ferroelectric capacitor is not formed, it is desirable to perform heat treatment at 350° C. or higher during the period from the formation of the silicon oxide film to the formation of the penetration inhibiting film. For example, the heat treatment is performed under the following conditions: Temperature=360° C.; $N_2$ flow rate=20 litter/minute; and Time=30 minutes. However, if the heat treatment at 400° C. or higher is performed, there is a possibility that the Al wiring and the like is deformed. On the other hand, when the ferroelectric capacitor is formed, it is desirable to perform heat treatment at 350° C. or lower during the period from the formation of the silicon oxide film to the formation of the penetration inhibiting film.

Moreover, in place of the $Al_2O_3$ film 35, an oxide film, a nitride film, a carbide film, or a polyimide film may be formed as the penetration inhibiting film. Examples of the oxide film are a titanium oxide film and a coating-type oxide film (for example, SOG (Spin on glass) film). Examples of the nitride film are a silicon nitride film, a silicon oxynitride film, and a boron nitride film. Examples of the carbide film are a silicon carbide film and a diamond-like carbon film. The thickness of the penetration inhibiting film is, for example, 20 nm or more, and preferably 50 nm or more. Incidentally, approximately 100 nm is sufficient for the thickness of the penetration inhibiting film. As examples of a method of forming the metal oxide film, a CVD method such as a MOCVD method and a sputtering method are given. When the silicon oxide film is heat-treated, it is desirable to move a wafer into another chamber without bringing the silicon oxide film into contact with the outside air after the heat treatment and form the metal oxide film there.

Further, as the conductive film, a Ti film, an Al film, an iridium oxide film, or the like may be formed in place of the TiN film 41.

Furthermore, the wiring material is not particularly limited, and an Al wiring, a Cu wiring, a Al—Cu alloy wiring, and the like may be used. Especially when the Cu wiring is formed, it is desirable to adopt a damascene method. Note that even when the Cu wiring or the Al—Cu alloy wiring is used, it is desirable to use the Al film as the pad.

Besides, in any of the embodiments, as the ferroelectric for example, a $PbZr_{1-x}Ti_xO_3$ film, a $Pb_{1-x}La_xZr_{1-y}Ti_yO_3$ film, a $SrBi_2(Ta_xNb_{1-x})_2O_9$ film, a $Bi_4Ti_2O_{12}$ film, or the like can be used. Moreover, as the wiring material, in addition to Al and Cu, an Al—Cu alloy or the like may be used.

When the present inventors actually carried out a high-temperature/high humidity test up to 672 hours on a ferroelectric memory manufactured by a method according to the third embodiment and a ferroelectric memory manufactured by a conventional method, results shown in Table 1 were obtained.

TABLE 1

| | Sample No. | Number of occurrence of defects (elapsed time) | | | |
|---|---|---|---|---|---|
| | | 168 hours | 336 hours | 504 hours | 672 hours |
| Method according to third embodiment | 1 | 0 | 0 | 0 | 0 |
| | 2 | 0 | 0 | 0 | 0 |
| | 3 | 0 | 1 | 2 | 2 |
| | 4 | 0 | 0 | 0 | 0 |
| | 5 | 0 | 0 | 0 | 0 |
| Conventional method | 6 | 19 | 34 | 51 | 72 |
| | 7 | 0 | 3 | 5 | 7 |
| | 8 | 0 | 0 | 0 | 0 |
| | 9 | 0 | 3 | 113 | 811 |
| | 10 | 106 | 1690 | 3253 | 5184 |

As shown in Table 1, many defects occurred in the conventional method, but in the method according to the third embodiment, the semiconductor device in which an extremely small number of defects occurred could be obtained. Namely, in the method according to the third embodiment, deterioration in the characteristics of the ferroelectric capacitor accompanying oxygen deficiency and the like due to reduction by moisture or hydrogen was inhibited.

According to the present invention, penetration of moisture into a silicon oxide film which allows moisture to relatively easily permeate therethrough around a conductive pad can be inhibited, which makes it possible to inhibit deterioration accompanying the penetration of moisture from the outside. Further, when a penetration inhibiting film is formed not only on a PAD section but also on a circuit and on a scribe, deterioration accompanying the penetration of moisture and hydrogen from the surface of a chip can be further inhibited. Accordingly, moisture resistance can be greatly improved.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a semiconductor device, comprising:
    forming a ferroelectric capacitor as an element;
    forming a conductive pad as a terminal for connecting the element to an external element via a contact hole;
    forming a silicon oxide film around the conductive pad to cover at least a portion of an upper surface of the conductive pad;
    annealing said silicon oxide film in an $N_2$ atmosphere;
    forming an $Al_2O_3$ penetration inhibiting film over said conductive pad and silicon oxide film, which inhibits penetration of hydrogen and moisture into the silicon oxide film; and
    forming a polyimide layer above the $Al_2O_3$ penetration inhibiting film having an opening exposing the conductive pad,
    wherein one portion of said conductive pad is not covered by said penetration inhibiting film.

2. The manufacturing method of the semiconductor device according to claim 1, wherein the $Al_2O_3$ film is formed so as to cover the silicon oxide film, and the method further comprises forming an opening to expose the conductive pad in the $Al_2O_3$ film.

3. The manufacturing method of the semiconductor device according to claim 1, further comprising forming a silicon nitride film on the penetration inhibiting film.

4. The manufacturing method of the semiconductor device according to claim 1, further comprising forming a silicon nitride film over the silicon oxide film after forming the penetration inhibiting film.

5. A manufacturing method of a semiconductor device, comprising:
    forming a ferroelectric capacitor as an element;
    forming a conductive pad as a terminal for connecting the element to an external element via a contact hole;
    forming a silicon oxide film around the conductive pad to cover at least a portion of an upper surface of the conductive pad;
    annealing said silicon oxide film in a $N_2$ atmosphere;
    forming an $Al_2O_3$ penetration inhibiting film over said conductive pad and silicon oxide film, which inhibits penetration of hydrogen and moisture into the silicon oxide film; and forming a polyimide layer above the $Al_2O_3$ penetration inhibiting film having an opening exposing the conductive pad,
wherein one portion of said conductive pad is covered by said penetration inhibiting film.

6. The manufacturing method of the semiconductor device according to claim 5, wherein the $Al_2O_3$ film is formed so as to cover the silicon oxide film, and the method further comprises forming an opening to expose the conductive pad in the $Al_2O_3$ film.

7. The manufacturing method of the semiconductor device according to claim 5, further comprising forming a silicon nitride film on the penetration inhibiting film.

8. The manufacturing method of the semiconductor device according to claim 5, further comprising forming a silicon nitride film over the silicon oxide film after forming the penetration inhibiting film.

* * * * *